US010078261B2

(12) United States Patent
Cho et al.

(10) Patent No.: US 10,078,261 B2
(45) Date of Patent: *Sep. 18, 2018

(54) SELF-ASSEMBLED STRUCTURES, METHOD OF MANUFACTURE THEREOF AND ARTICLES COMPRISING THE SAME

(71) Applicants: The Texas A&M University System, College Station, TX (US); Rohm and Haas Electronic Materials LLC, Marlborough, MA (US)

(72) Inventors: Sangho Cho, Bryan, TX (US); Guorong Sun, Bryan, TX (US); Karen L. Wooley, College Station, TX (US); James W. Thackeray, Braintree, MA (US); Peter Trefonas, III, Medway, MA (US)

(73) Assignees: ROHM AND HAAS ELECTRONIC MATERIALS LLC, Marlborough, MA (US); THE TEXAS A&M UNIVERSITY SYSTEM, College Station, TX (US)

( * ) Notice: Subject to any disclaimer, the term of this patent is extended or adjusted under 35 U.S.C. 154(b) by 319 days.

This patent is subject to a terminal disclaimer.

(21) Appl. No.: 14/020,343

(22) Filed: Sep. 6, 2013

(65) Prior Publication Data

US 2015/0072291 A1 Mar. 12, 2015

(51) Int. Cl.
*C08L 51/00* (2006.01)
*G03F 7/038* (2006.01)
(Continued)

(52) U.S. Cl.
CPC .......... *G03F 7/038* (2013.01); *C08F 293/005* (2013.01); *C08G 61/08* (2013.01);
(Continued)

(58) Field of Classification Search
CPC ........ C08G 2261/126; C08G 2261/128; C08G 2261/131; C08G 2261/14;
(Continued)

(56) References Cited

U.S. PATENT DOCUMENTS 5,750,587 A 5/1998 Manzouji et al.
6,166,101 A 12/2000 Takami
(Continued)

FOREIGN PATENT DOCUMENTS

CN 1241732 A 1/2000
CN 102030871 A 4/2011
(Continued)

OTHER PUBLICATIONS

Amir, R. J. et al. "Enzymatically Triggered Self-Assembly of Block Copolymers" J. Am. Chem. Soc. 2009, 131, 13949-13951.
(Continued)

*Primary Examiner* — Amanda C Walke
(74) *Attorney, Agent, or Firm* — Cantor Colburn LLP

(57) ABSTRACT

Disclosed herein is a graft block copolymer comprising a first block polymer; the first block polymer comprising a backbone polymer and a first graft polymer; where the first graft polymer comprises a surface energy reducing moiety that comprises a halocarbon moiety, a silicon containing moiety, or a combination of a halocarbon moiety and a silicon containing moiety; a second block polymer; the second block polymer being covalently bonded to the first block; wherein the second block comprises the backbone polymer and a second graft polymer; where the second graft polymer comprises a functional group that is operative to undergo acid-catalyzed deprotection causing a change of solubility of the graft block copolymer in a developer solvent.

9 Claims, 5 Drawing Sheets

(51) Int. Cl.

| | | |
|---|---|---|
| *C08F 293/00* | (2006.01) | |
| *C08G 61/08* | (2006.01) | |
| *G03F 7/00* | (2006.01) | |
| *G03F 7/004* | (2006.01) | |
| *G03F 7/039* | (2006.01) | |

(52) U.S. Cl.
CPC .......... *C08L 51/003* (2013.01); *G03F 7/0002* (2013.01); *G03F 7/0045* (2013.01); *G03F 7/0046* (2013.01); *G03F 7/0395* (2013.01); *G03F 7/0397* (2013.01); *C08F 2438/03* (2013.01); *C08G 2261/126* (2013.01); *C08G 2261/128* (2013.01); *C08G 2261/136* (2013.01); *C08G 2261/1426* (2013.01); *C08G 2261/3324* (2013.01); *C08G 2261/418* (2013.01); *C08G 2261/80* (2013.01); *C08G 2261/90* (2013.01)

(58) Field of Classification Search
CPC ...... C08G 2261/1426; C08G 2261/144; C08G 2261/145; C08G 2261/146; C08G 2261/15; C08G 2261/418; C08G 2261/1452; C08G 2261/3324; C08G 2261/74; C08F 283/14; C08F 287/00; C08L 51/003
USPC .......... 526/243, 242, 280; 525/88, 276, 342
See application file for complete search history.

(56) References Cited

U.S. PATENT DOCUMENTS

| | | | |
|---|---|---|---|
| 6,392,008 | B1 | 5/2002 | Allcock |
| 6,632,879 | B2 | 10/2003 | Brann |
| 7,261,993 | B2 | 8/2007 | Schadt, III et al. |
| 7,662,996 | B2 | 2/2010 | Bell |
| 8,765,894 | B2 * | 7/2014 | Bell et al. ............ 526/280 |
| 8,822,130 | B2 * | 9/2014 | Cho et al. ............ 430/270.1 |
| 2002/0058198 | A1 | 5/2002 | Klauck-Jacobs |
| 2003/0129527 | A1 | 7/2003 | Kudo et al. |
| 2003/0148209 | A1 | 8/2003 | Fujita et al. |
| 2004/0248039 | A1 | 12/2004 | Sounik |
| 2005/0069807 | A1 | 3/2005 | Jung |
| 2005/0182220 | A1 | 8/2005 | Liaw |
| 2007/0037940 | A1 | 2/2007 | Lazzari |
| 2008/0176767 | A1 | 7/2008 | Millward |
| 2008/0193658 | A1 | 8/2008 | Millward |
| 2008/0194450 | A1 | 8/2008 | Yamamoto et al. |
| 2010/0022741 | A1 | 1/2010 | Cheng |
| 2010/0099906 | A1 * | 4/2010 | Bell et al. ............ 558/428 |
| 2010/0173245 | A1 | 7/2010 | Wang et al. |
| 2010/0304290 | A1 | 12/2010 | Wang |
| 2011/0143260 | A1 * | 6/2011 | Bell et al. ............ 429/501 |
| 2011/0147983 | A1 | 6/2011 | Cheng et al. |
| 2012/0046415 | A1 | 2/2012 | Millward |
| 2012/0202017 | A1 | 8/2012 | Nealey et al. |
| 2013/0072650 | A1 * | 3/2013 | Tew et al. ............ 526/259 |
| 2013/0296491 | A1 * | 11/2013 | Xia et al. ............ 525/89 |
| 2013/0298590 | A1 * | 11/2013 | Heinzl ............ 62/271 |
| 2013/0324666 | A1 * | 12/2013 | Xia et al. ............ 525/182 |
| 2014/0011958 | A1 * | 1/2014 | Miyake et al. ............ 525/280 |
| 2014/0030652 | A1 | 1/2014 | Senzaki |
| 2014/0141375 | A1 | 5/2014 | Cho |
| 2014/0142249 | A1 | 5/2014 | Cho |
| 2014/0142252 | A1 | 5/2014 | Cho |
| 2015/0072292 | A1 | 3/2015 | Cho |

FOREIGN PATENT DOCUMENTS

| | | | |
|---|---|---|---|
| JP | 2000017232 | A | 1/2000 |
| JP | 2003327912 | A | 11/2003 |
| JP | 2007204636 | A | 8/2007 |
| JP | 2013253228 | A | 12/2013 |
| JP | 2013253232 | A | 12/2013 |
| KR | 20030028987 | A | 4/2003 |
| TW | I271411 | B | 1/2007 |
| WO | 02093676 | A2 | 11/2002 |
| WO | 2005070988 | A1 | 8/2005 |
| WO | WO2006129800 | A1 | 12/2006 |
| WO | 2008027268 | A2 | 3/2008 |
| WO | 2010026944 | A1 | 3/2010 |

OTHER PUBLICATIONS

Bolton, Justin, et al.; "Large Pore Size Nanporous Materials fromthe Self-Assembly of Asymmetric Bottlebrush Block Copoloymers"; Department of Chemistry, University at Buffalo; ACS Publications; NANO Letter, 2011, American Chemical Society; 11, 998-1001.

Hosano et al. "Large Area Three-Dimensional Molecular Ordering of a Polymer Brush by One-Step Processing" Science 330, pp. 808-811 Publication Date Nov. 5, 2010.

Lee, Hyung-il, et al; "Stimuli-responsive molecular brushes"; Progress in Polymer Science/Elsevier Journal; vol. 35; Oct. 30, 2009; p. 24-44.

Leitgeb, Anita, et al; "The ROMP toolbox upgraded"; Institute for Chemistry and Technology of Materials (ICTM), Graz University of Technology, Stremayrgasse 16, A-8010 Graz, Australia; Polymer/ Elsevier Jornal 51 (2010) p. 2927-2946.

Li, A. et al., "One-Pot, Facile Synthesis of Well-Defined Molecular Brush Copolymers by a Tandem RAFT and ROMP,—"Grafting-Through" Strategy" J. Polym. Sci., Part A: Polym. Chem. 2012, 50, 1681-1688.

Li, Z., et al. "Dynamic Cylindrical Assembly of Triblock Copolymers by a Hierarchical Process of Covalent and Supramolecular Interactions" J. Am. Chem. Soc. 2011, 133, 1228-1231.

Macromolecule (polymer molecule) PAC, 1996, 68, 2287 (Glossary of basic terms in polymer science (IUPAC Recommendations 1996)) on p. 2289.

Nomura, Kotohiro, et al; "Precise synthesis of polymers containing functional end groups by living ring-opening metathesis polymerization (ROMP): Efficient tools for synthesis of block/gaft copolymers"; Graduate School of Materials Science, Nara Institute of Science Technology (NAIST), 8916-5 Takayama, Ikoma, Nara 630-0101; Japan; Polymer/Elsevier jornal.

Pitois, C. et al., "Functionalized Fluorinated Hyperbranched Polymers for OpticalWaveguide Applications" Adv. Mater. 2001, 13, No. 19, Oct. 2, 1483-1487.

Sheiko, Sergei, et al; "Cylindrical Molecular Brushes: Synthesis, characterization, and properties"; Prosgress in Polymer Science, Elsevier Journal vol. 33, May 8, 2008; p. 759-785.

Sun et al., "Nanoscopic Cylindrical Dual Concentric and Lengthwise Block Brush Terpolymers as Covalent Preassembled High-Resolution and High-Sensitivity Negative-Tone Photoresist Materials" Journal of the American Chemical Society, 2013, 135, pp. 4203-4206, published Mar. 12, 2013.

Sutthasupa, Sutthira, et al; "Recent advances in ring-opening matathesis polymerization, and application to synthesis of functional materials"; Polymer Journal Sep. 6, 2010 42, p. 905-915; The Socity of Polymer Science, Japan.

Zhang, Mingfu; "Cylindrical Polymer Brushes"; Polymer Science and Engineering, University of Massachusetts, Amherst, Massachusetts; Journal of Polymer Science; Apr. 15, 2005; p. 3461-3481.

Cho, "Investigation of a fluorinated ESCAP based resist for 157 nm lithography" Advances in Resist Technology and Processing XIX; Proceedings of SPIE vol. 4690 (2002) pp. 522-532.

Lee, et al. "Stimuli-responsive molecular brushes" Progress in Polymer Science 35 (2010) 24-44.

Li, et al. "Dynamic Cylindrical Assembly of Triblock Copolymers by a Hierarchaical Process of Covalent and Supramolecular Interations" J. Am. Chem. Soc. 2011, 133, 1228-1231.

Nomura et al. "Precise synthesis of polymers containing functional end groups by living ring-opening metathesis polymerization (ROMP): Efficient tools for synthesis of block/graft copolymers" vol. 51, Issue 9, Apr. 20, 2010, pp. 1861-1881.

(56) References Cited

OTHER PUBLICATIONS

Benjamin R. Sveinbjörnsson, et al., "Rapid self-assembly of brush block copolymers to photonic crystals" Proc. Natl. Sci. USA 2013 110 (49) 19707-19712.

Lanson, David et al. "Poly(styrene)comb-b-Poly(ethylene oxide)comb Copolymers: Synthesis and AFM Investigation of Intra- and Supramolecular Organization as Thin Deposits" Macromolecules, 2007, 40 (26), pp. 9503-9509.

Lanson, David et al. "Synthesis of (Poly(chloroethyl vinyl ether)-g-polystyrene)comb-b-(poly(chloropyran ethoxy vinyl ether)-g-polyisoprene)comb Copolymers and Study of Hyper-Branched Micelle Formation in Dilute Solutions" Macromolecules, IPT ERROR FINIS.

Lee, et al. "Hetero-Grafted Block Brushes with PCL and PBA Side Chains" Macromolecules 2008, 41, 6073-6080.

"acrylic/chemistry/Britannica.com" from Encyclopedia Britannica, htpp://www.britannica.com/science/acrylic, downloaded Dec. 28, 2015 (2 pages).

Grant et al., Grant & Hackh's Chemical Dictionary, fifth Ed., McGraw-Hill Book Company, New York, N.Y. 1987, p. 13.

\* cited by examiner ized structures, method of manufacture thereof and articles comprising the same

BACKGROUND

This disclosure relates to self-assembled structures, methods of manufacture thereof and to articles comprising the same.

Block copolymers form self-assembled nanostructures in order to reduce the free energy of the system. Nanostructures are those having average largest widths or thicknesses of less than 100 nanometers (nm). This self-assembly produces periodic structures as a result of the reduction in free energy. The periodic structures can be in the form of domains, lamellae or cylinders. Because of these structures, thin films of block copolymers provide spatial chemical contrast at the nanometer-scale and, therefore, they have been used as an alternative low-cost nano-patterning material for generating nanoscale structures. While these block copolymer films can provide contrast at the nanometer scale, it is often difficult to produce copolymer films that can display periodicity at less than 60 nm. Modern electronic devices however often utilize structures that have a periodicity of less than 60 nm and it is therefore desirable to produce copolymers that can easily display structures that have average largest widths or thicknesses of less than 60 nm, while at the same time displaying a periodicity of less than 60 nm.

Many attempts have been made to develop copolymers that have minimum pattern dimensions of less than 60 nm, while at the same time displaying a periodicity of less than 60 nm. The assembly of polymer chains into a regular array, and especially a periodic array, is sometimes referred to as "bottom up lithography". The processes for forming periodic structures for electronic devices from block copolymers, which are aligned to guiding features on the substrate within lithography are known as "directed self-assembly'. However, four of the challenges in trying to build a workable electronic device from a periodic array have to do with a) the desire to register or align that periodic array with great precision and accuracy to the underlying elements of the circuit pattern, b) secondly the desire to form non-periodic shapes in the pattern as part of the electronic circuit design, c) thirdly the ability for the pattern to form sharp bends and corners and line ends as part of the circuit design pattern layout design, and d) the ability for the pattern to be formed in a multitude of periodicities. These limitations with bottom-up lithography using periodic patterns formed from block copolymers have resulted in the need to design complex chemoepitaxy or graphoepitaxy process schemes for alignment, pattern formation and defect reduction.

Conventional 'top down' lithography, which creates patterns through projection and focusing of light or energetic particles through a mask onto a thin photoresist layer on a substrate, or in the case of electron beam lithography may involve projection of electrons through an electromagnetic field in a pattern-wise manner onto a thin photoresist layer on a substrate, has the advantage of being more amenable to conventional methods of alignment of the pattern formation to the underlaying elements of the circuit pattern, and being able to form non-periodic shapes in the pattern as part of the circuit design, being able to directly form line ends and sharp bends, and the ability to form patterns in a multiplicity of periodicities. However, top down lithography, in the case of optical lithography, is constrained in the smallest pattern it can form, as a result of the diffraction of light through mask openings whose dimension is similar or smaller than the wavelength, which causes loss of light intensity modulation between the masked and unmasked regions. Other important factors which limit resolution are light flare, reflection issues from various film interfaces, imperfections in the optical quality of the lens elements, focal depth variations and tilt, vibrations during exposure, photon and photoacid shot noise and line edge roughness. In the case of electron beam lithography, the smallest useful pattern sizes which can be formed are limited by the beam spot size, the ability to stitch or merge writing patterns effectively and accurately, electron scatter and backscatter in the photoresist and underlying substrates, electron and photoacid shot noise and line edge roughness. Electron beam lithography is also highly limited by throughput, since the images are pattern-wise formed pixel-by-pixel, because as smaller pixel dimensions are required for smaller pattern sizes, the number of imaging pixels per unit area increases as the square of the pixel unit dimension.

SUMMARY

Disclosed herein is a graft block copolymer comprising a first block polymer; the first block polymer comprising a backbone polymer and a first graft polymer; where the first graft polymer comprises a surface energy reducing moiety that comprises a halocarbon moiety, a silicon containing moiety, or a combination of a halocarbon moiety and a silicon containing moiety; a second block polymer; the second block polymer being covalently bonded to the first block; wherein the second block comprises the backbone polymer and a second graft polymer; where the second graft polymer comprises a functional group that is operative to undergo acid-catalyzed deprotection causing a change of solubility of the graft block copolymer in a developer solvent.

Disclosed herein too is a method of manufacturing a graft block copolymer comprising reacting a precursor to a backbone polymer with a first chain transfer agent to form a first backbone polymer precursor-chain transfer agent moiety; reacting the first backbone polymer precursor-chain transfer agent moiety with a precursor to a first graft polymer; polymerizing the precursor to the first graft polymer to form a first graft polymer; where the first graft polymer comprises a surface energy reducing moiety that comprises a halocarbon moiety, a silicon containing moiety or a combination of a halocarbon moiety and a silicon containing moiety; polymerizing the backbone polymer precursor of the first backbone polymer precursor-chain transfer agent moiety to form the first block polymer; reacting a precursor to a backbone polymer with a second chain transfer agent to form a second backbone polymer precursor-chain transfer agent moiety; reacting the second backbone polymer precursor-chain transfer agent moiety with a second polymer to form the second graft copolymer; polymerizing the second backbone polymer precursor of the second backbone polymer precursor-chain transfer agent moiety to form the second block polymer; where the second graft polymer comprises a functional group that is operative to undergo acid-catalyzed deprotection causing a change of solubility of the graft block copolymer in a developer solvent; and reacting the first block polymer with the second block polymer to form the graft block copolymer.

BRIEF DESCRIPTION OF THE DRAWINGS

FIGS. 3(A) through (G) reflect AFM height image of pattern from Table 1 Entry #10, #11, #6, #7, #8, #14, and #16, respectively;

FIG. 4(A) shows patterns with 120 nm/70 nm line/space designed features. FIG. 4 (B) shows patterns with 100 nm/100 nm line/space designed features. FIG. 4 (C) shows patterns with 60 nm/100 nm line/space designed features; FIG. 5 (A) shows patterns with 120 nm/70 nm line/space designed features. FIG. 5 (B) shows patterns with 100 nm/100 nm line/space designed features.

DETAILED DESCRIPTION

Figure 1:
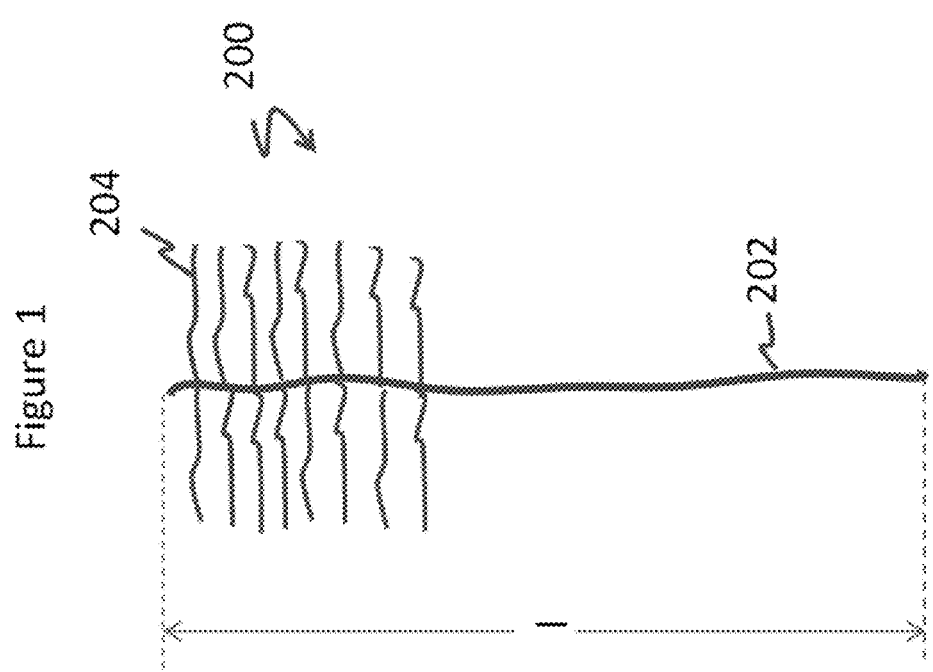
FIG. 1 is a schematic depiction of an exemplary brush polymer that is disposed upon a substrate.

The following table details acronyms and their expanded versions used herein.

TABLE

| PBCAR | positive-tone bottle brush chemically amplified resist |
|---|---|
| BBBP | block bottle brush polymer |
| M1 | macromonomer 1 |
| M2 | macromonomer 2 |
| macro-CTA | macro chain-transfer agent |
| TPS-DFSEMA | triphenylsulfonium 1,1-difluoro-2-(methacryloxy)ethanesulfonate |
| ECPMA | 1-ethylcyclopentyl methacrylate |
| GBLMA | γ-butyrolactone-2-yl methacrylate |
| BTFHMBMA | 5,5,5-trifluoro-4-hydroxy-2-methyl-4-(trifluoromethyl)pentyl methacrylate |

As used herein, "phase-separate" refers to the propensity of the blocks of block copolymers to form discrete microphase-separated domains, also referred to as "microdomains" or "nanodomains" and also simply as "domains". The blocks of the same monomer aggregate to form periodic domains, and the spacing and morphology of domains depends on the interaction, size, and volume fraction among different blocks in the block copolymer. Domains of block copolymers can form during application, such as during a spin-casting step, during a heating step, or can be tuned by an annealing step. "Heating", also referred to herein as "baking" or "annealing", is a general process wherein the temperature of the substrate and coated layers thereon is raised above ambient temperature. "Annealing" can include thermal annealing, thermal gradient annealing, solvent vapor annealing, or other annealing methods. Thermal annealing, sometimes referred to as "thermal curing" can be a specific baking process for fixing patterns and removing defects in the layer of the block copolymer assembly, and generally involves heating at elevated temperature (e.g., 150° C. to 350° C.), for a prolonged period of time (e.g., several minutes to several days) at or near the end of the film-forming process. Annealing, when performed, is used to reduce or remove defects in the layer (referred to as a "film" hereinafter) of microphase-separated domains.

The self-assembling layer comprises a block copolymer having at least a first block and a second block that forms domains through phase separation that orient perpendicular to the substrate upon annealing. "Domain", as used herein, means a compact crystalline, semi-crystalline, or amorphous region formed by corresponding blocks of the block copolymer, where these regions may be lamellar or cylindrical and are formed orthogonal or perpendicular to the plane of the surface of the substrate and/or to the plane of a surface modification layer disposed on the substrate. In an embodiment, the domains may have an average largest dimension of 1 to 50 nanometers (nm), preferably 2 to 40 nm, and still more preferably 3 to 20 nm.

The term "$M_n$" used herein and in the appended claims in reference to a block copolymer of the present invention is the number average molecular weight of the block copolymer (in g/mol) determined according to the method used herein in the Examples. The term "$M_w$" used herein and in the appended claims in reference to a block copolymer of the present invention is the weight average molecular weight of the block copolymer (in g/mol) determined according to the method used herein in the Examples.

The term "PDI" or "Đ" used herein and in the appended claims in reference to a block copolymer of the present invention is the polydispersity (also called polydispersity index or simply "dispersity") of the block copolymer determined according to the following equation:

$$PDI = \frac{M_w}{M_n}.$$

The transition term "comprising" is inclusive of the transition terms "consisting of" and "consisting essentially of". The term "and/or" is used herein to mean both "and" as well as "or". For example, "A and/or B" is construed to mean A, B or A and B.

Disclosed herein is a graft block copolymer that comprises a polymer as its backbone (hereinafter the backbone polymer) with a first polymer and a second polymer that are grafted onto the backbone polymer. The first polymer comprises a surface energy reducing moiety that comprises either fluorine, silicon or a combination of fluorine and silicon. The second polymer also comprises a functional group that is used to change the solubility of or to deprotect the graft block copolymer after it is disposed upon a substrate. Each of the backbone and the graft polymers can be a homopolymer or a copolymer or copolymer segments in a deprotecting operation. The graft block copolymer can self-assemble in the form of a plurality of bottle-brushes when disposed upon a substrate. The graft block copolymer can then be assembled to form a film that comprises bottle-brushes. The polymer backbone is topologically similar to the handle of a bottle-brush, while the polymer grafts emanate radially outwards from the graft block copolymer backbone to form a structure that is similar to the bristles of the bottle-brush, hence the use of the term "bottle-brush". The polymer grafts emanating from the copolymer backbone can be flexible or stiff, or intermediate between flexible and stiff, and hence this can affect the approximate diameter of the bottle brush copolymer. The polymer backbone and graft lengths can be varied independently to control the lengths and diameters of the bottle brush copolymer structures.

The term (meth)acrylic is meant to imply acrylics as well as a methacrylics. Likewise, the term (meth)acrylate is meant to imply acrylates as well as methacrylates.

Disclosed herein too is a graft block copolymer that comprises a plurality of block copolymers each of which comprise the backbone polymer and where the first polymer and a second polymer are grafted onto the backbone. The backbone polymer may be a homopolymer or a block copolymer. The first polymer and the second polymer can be homopolymers or copolymers. In an exemplary embodiment, the first polymer is a homopolymer that comprises a surface energy reducing moiety, while the second polymer is a copolymer that has a functional group through which the graft block copolymer is deprotected. When the graft block copolymer is disposed upon a substrate it forms a film that comprises bottle-brush polymers that are then deprotected by reacting the functional groups to alter the solubility.

In one embodiment, the graft block copolymer comprises a first block polymer and a second block polymer. The first block polymer thus comprises the backbone polymer with the first polymer (a homopolymer) grafted onto the backbone polymer. The first polymer is also referred to herein as the first graft polymer. The second block polymer comprises the backbone polymer with the second polymer (a copolymer) grafted onto the backbone polymer. The second polymer is also referred to herein as the second graft polymer. The first graft polymer and the second graft polymer are also referred to as flexible polymers. The first block polymer is therefore a copolymer while the second block polymer can be a copolymer, a terpolymer or a quadrapolymer (a polymer having at least 4 blocks). The first polymer and/or the second polymer comprises a functional group that is used to deprotect functionalities of the graft block copolymer. In one embodiment, the graft block copolymer is deprotected after it is disposed upon a substrate. The graft block copolymer may comprise one or more photoacid generators. In an embodiment, the first block polymer comprises a photoacid generator and the second block copolymer comprises a photoacid generator.

The first polymer comprises the surface energy reducing moiety that drives higher degrees of self-assembly when the graft block copolymer is disposed upon a substrate. The presence of the surface energy reducing moiety results in domain sizes and inter domain periodic spacing that are less than 1 to 50 nanometers (nm), preferably 2 to 40 nm, and still more preferably 3 to 20 nm, when the copolymer is disposed upon a substrate. These narrow domain sizes and narrow interdomain spacings are very useful for lithography. They can be used to produce semiconductors and other electronic components. In one embodiment, the graft block copolymer can be rendered soluble in an aqueous alkaline developer solution by a photoacid catalyzed deprotection reaction and then used as a positive tone photoresist. In another embodiment, the graft block copolymer is not cross-linked, but rendered insoluble by a photoacid catalyzed deprotection reaction combined with the selection of the appropriate organic solvent developer and is used as a negative tone photoresist.

Disclosed herein too is a method of manufacturing the graft block copolymer. The method comprises producing a series of macromonomers (that form the backbone polymer) and then performing sequential grafting-through polymerizations to create the graft copolymer. Alternatively, grafting-onto or grafting-from techniques can be used for the graft copolymer syntheses.

Disclosed herein too is a photoresist composition that comprises the graft block copolymer having functional groups which can be deprotected by the action of catalytic amounts of photoacid, generated from a photoacid generator. The photoresist composition is manufactured by dissolving the bottle-brush polymers that have both the surface energy reducing and reactive moieties along with optional photoacid generator molecules in an appropriate organic coating solvent to form a single liquid phase composition, and then filtering the liquid composition through a microfilter capable of removing fine particles, and storing the filtered liquid in a clean sealed container. Disclosed herein too are articles that comprise the graft block copolymer. In one embodiment, the article comprises a photoresist.

FIG. 1 depicts a polymeric graft block copolymer 200 (having a bottle brush morphology) that comprises a polymer backbone 202 (hereinafter the "backbone polymer") of length "l" that is reacted to the graft polymer 204 (hereinafter the "first graft polymer)". The first graft polymer can be covalently reacted to the polymer backbone or can form the polymer backbone along a portion of the length of the backbone or along the entire length of the backbone. The first polymer can also be covalently bonded to or can form the backbone polymer backbone 202 along the entire length of the backbone and could extend radially outward in any direction or combination of directions from the backbone or along a portion of the circumference of the backbone. In our nomenclature, bottle-brush polymers are different from polymer brushes in that in a polymer brush, the graft polymer is reacted to only one surface of a substrate, while in a bottle brush polymer, the graft polymer is grafted on all sides of the polymer backbone, thus producing a morphology that appears to be bottle-brush like in appearance. Polymer brushes are analogous in morphology to a field of grass, where the polymer is the grass and is disposed on a substrate (which is analogous to the soil in which the grass grows).

In one embodiment, the graft block copolymers 200 self-assemble (upon being disposed upon a surface) such that the resulting assembly displays order in at least one direction, specifically at least in two directions, and more specifically at least in three directions. In one embodiment, the graft block copolymer bottle-brushes self-assemble (upon being disposed upon a surface) such that the resulting assembly displays order in at least two mutually perpendicular directions, and more specifically in at least three mutually perpendicular directions. The term "order" refers to periodicity between repeating structures in the assembly when measured in a particular direction.

The backbone polymer precursor is generally used to form the polymer backbone 202 of the graft block copolymer. It is desirable for the backbone polymer precursor that forms the backbone to allow for sequential polymerization of macromonomers to manufacture the graft block copolymers. In one embodiment, the backbone polymer precursor can be one that comprises a strained ring along the chain backbone. In another embodiment, the backbone polymer precursor can be a polyacetal, a polyacrylic, a polycarbonate, a polystyrene, a polyester, a polyamide, a polyamideimide, a polyarylate, a polyarylsulfone, a polyethersulfone, a polyphenylene sulfide, a polyvinyl chloride, a polysulfone, a polyimide, a polyetherimide, a polytetrafluoroethylene, a polyetherketone, a polyether etherketone, a polyether ketone ketone, a polybenzoxazole, a polyoxadiazole, a polybenzothiazinophenothiazine, a polybenzothiazole, a polypyrazinoquinoxaline, a polypyromellitimide, a polyquinoxaline, a polybenzimidazole, a polyoxindole, a polyoxoisoindoline, a polydioxoisoindoline, a polytriazine, a polypyridazine, a polypiperazine, a polypyridine, a polypiperidine, a polytriazole, a polypyrazole, a polypyrrolidine, a polycarborane, a polyoxabicyclononane, a polydibenzofuran, a polyphthalide, a polyanhydride, a polyvinyl ether, a polyvinyl thioether, a polyvinyl alcohol, a polyvinyl ketone, a polyvinyl halide, a polyvinyl nitrile, a polyvinyl ester, a polysulfonate, a polynorbornene, a polysulfide, a polythioester, a polysulfonamide, a polyurea, a polyphosphazene, a polysilazane, a polyurethane, or the like, or a combination including at least one of the foregoing polymers. In an exemplary embodiment, the backbone polymer is polynorbornene. The ring of the polynorbornene repeat units may, if desired, be substituted with an alkyl group, an araalkyl group, or an aryl group.

The number of repeat units in the backbone polymer (that forms the backbone of the copolymer) is about 3 to about 100, preferably about 4 to about 70, preferably about 5 to about 50. The number average molecular weight of the backbone is 200 to 10,000 grams per mole as measured by GPC. In a preferred embodiment, the number average molecular weight of the backbone is 3,050 to 10,500 grams per mole as measured by GPC.

The backbone polymer precursor (that forms the polymer backbone) has grafted through it the first polymer thereby forming a graft copolymer. In one embodiment, the backbone polymer has grafted through it one or more different types of graft polymers. In another embodiment, the backbone polymer has grafted through it two or more different types of graft polymers. The graft block copolymer can thus be a block copolymer, an alternating copolymer, an alternating block copolymer, a random copolymer, or a combination thereof.

In one embodiment, the graft block copolymer can comprise the backbone polymer with a first polymer that is grafted through the backbone polymer. The first polymer is preferably a homopolymer and comprises the surface energy reducing moiety. The surface energy reducing moieties generally comprise silicon atoms, fluorine atoms, or a combination of fluorine atoms and silicon atoms. The surface energy reducing moiety facilitates a high degree of self-assembly when the graft block copolymer is disposed upon a substrate. The first polymer may be covalently or noncovalently (e.g. ionically, via hydrogen bonding, and the like) bonded onto the backbone polymer. In an exemplary embodiment, the first polymer is covalently bonded onto the backbone polymer.

In one embodiment, the first polymer is derived from the polymerization of halocarbon monomers or silicon containing monomers. The monomers that contain the surface energy reducing moiety can be aliphatic or cycloaliphatic monomers that comprise fluorine atoms, silicon atoms or combinations of fluorine and silicon atoms. Examples of aliphatic monomers that contain fluorine atoms are fluorinated (meth)acrylics, fluorinated (meth)acrylates, silicone (meth)acrylics, silicone (meth)acrylates, or the like, or a combination comprising at least one of the foregoing aliphatic or cycloaliphatic monomers that comprise fluorine atoms, silicon atoms or combinations of fluorine and silicon atoms.

Examples of fluorinated (meth)acrylics or fluorinated (meth)acrylates from which the first polymer can be derived are 5,5,5-trifluoro-4-hydroxy-2-methyl-4-(trifluoromethyl) pentyl methacrylate (also known as 1,1,1-trifluoro-2-(trifluoromethyl)-2-hydroxy-4-methyl-5-pentyl methacrylate) ($C_{11}H_{14}F_6O_3$), 3,3,4,4,5,5,6,6,7,7,8,8,9,9,10,10,11,12,12,12-eicosafluoro-11-(trifluoromethyl)dodecyl methacrylate ($C_{17}H_9F_{23}O_2$), 3,3,4,4,5,5,6,6,7,7,8,8,9,9,10,10,11,11,12,12,12-heneicosafluorododecyl acrylate ($C_{15}H_7F_{21}O_2$), 3,3,4,4,5,5,6,6,7,7,8,8,9,9,10,10,11,11,12,12,12-heneicosafluorododecyl methacrylate ($C_{16}H_9F_{21}O_2$), 3,3,4,4,5,5,6,6,7,7,8,8,9,9,10,10,10-heptadecafluorodecyl methacrylate ($C_{14}H_9F_{17}O_2$), 2,2,3,3,4,4,4-heptafluorobutyl acrylate ($C_7H_5F_7O_2$), 2,2,3,3,4,4,4-heptafluorobutyl methacrylate ($C_8H_7F_7O_2$), 2,2,3,4,4,4-hexafluorobutyl acrylate ($C_7H_6F_6O_2$), 2,2,3,4,4,4-hexafluorobutyl methacrylate ($C_8H_8F_6O_2$), 1,1,1,3,3,3-hexafluoroisopropyl acrylate ($C_6H_4F_6O_2$), 1,1,1,3,3,3-hexafluoroisopropyl methacrylate ($C_7H_6F_6O_2$), 2,2,3,3,4,4,5,5-octafluoropentyl acrylate ($C_8H_6F_8O_2$), 2,2,3,3,4,4,5,5-octafluoropentyl methacrylate ($C_9H_8F_8O_2$), 2,2,3,3,3-pentafluoropropyl acrylate ($C_6H_5F_5O_2$), 2,2,3,3,3-pentafluoropropyl methacrylate ($C_7H_7F_5O_2$), 1H,1H,2H,2H- perfluorodecyl acrylate ($C_{13}H_7F_{17}O_2$), 2,2,3,3-tetrafluoropropyl methacrylate ($C_7H_8F_4O_2$), 3,3,4,4,5,5,6,6,7,7,8,8,8-tridecafluorooctyl acrylate ($C_{11}H_7F_{13}O_2$), 3,3,4,4,5,5,6,6,7,7,8,8,8-tridecafluorooctyl methacrylate ($C_{12}H_9F_{13}O_2$), 2,2,2-trifluoroethyl methacrylate ($C_6H_7F_3O_2$), 1,1,1-trifluoro-2-(trifluoromethyl)-2-hydroxy-4-methyl-5-pentyl methacrylate ($C_{11}H_{14}F_6O_3$), 2-[(1',1',1'-trifluoro-2'-(trifluoromethyl)-2'-hydroxy)propyl]-3-norbornyl methacrylate ($C_{15}H_{18}F_6O_3$), or the like, or a combination comprising at least one of the foregoing monomers. It is to be noted that one or more fluorine atoms on the aforementioned fluorocarbon molecules can be replaced by a hydrogen atom, alkyl groups having 2 to 10 carbon atoms, or other halogen atoms (e.g., bromine, chlorine, iodine or astatine).

In an exemplary embodiment, the first polymer is derived from the polymerization of 5,5,5-trifluoro-4-hydroxy-2-methyl-4-(trifluoromethyl)pentyl methacrylate.

In one embodiment, it is desirable for the first polymer to have a water contact angle of 70 to 100 degrees. In an exemplary embodiment, it is desirable for the first polymer to have a preferred water contact angle of 85 to 95 degrees. The first polymer generally has a number of repeat units of 5 to 30, preferably 8 to 25, and more specifically 9 to 20. In one embodiment, the first polymer has a number average molecular weight of 5,100 to 5,700 Daltons when measured using gel permeation chromatography (GPC). The first polymer has a polydispersity index (PDI) of 1.05 to 1.20, specifically 1.08 to 1.12 as determined by GPC.

In an exemplary embodiment, the first block polymer of the graft block copolymer comprises a polynorbornene backbone polymer to which is grafted the first polymer that is derived from the polymerization of 5,5,5-trifluoro-4-hydroxy-2-methyl-4-(trifluoromethyl)pentyl methacrylate and has the structure in the formula (1) below:

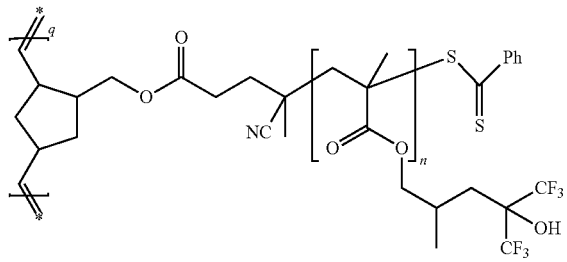

(1), where Ph is an aryl group, n is 5 to 25 and q is 3 to 75.

As detailed above, the graft block copolymer can also comprise a second polymer that is grafted onto the backbone polymer in addition to the first polymer. The first polymer is the homopolymer detailed above, while the second polymer is a homopolymer, a copolymer, a terpolymer or a quadrapolymer. In one embodiment, the second polymer does not contain a surface energy reducing moiety that comprises silicon, fluorine, or a combination of silicon or fluorine. In another embodiment, the second polymer contains the surface energy reducing moiety that comprises silicon, fluorine, or a combination of silicon or fluorine, but has a different chemical structure from the first polymer. The second polymer may also contain a functional group that facilitates deprotection of the graft block copolymer.

In one embodiment, the second polymer is a homopolymer or copolymer derived from the polymerization of a monomer or monomers that contains a moiety that can facilitate deprotection of the graft block copolymer after being disposed on the surface. The monomer can comprise a acid-catalyzed deprotectable moiety, examples of said moieties can include esters, acetals, acyls, orthoesters alcohols, silyl esters, thioesters, carbonates, peroxides, benzoyls, silyl ethers, tetrahydropyranyl, tetrahydrofuranyl, trityl, alkoxyalkyl ethers, carbamates, tosyl amines, tosyl amides, sulfonamides, oxazolines, phosphate esters, propargyls, or a combination comprising at least one of the foregoing monomers or moieties. The moiety that facilitates deprotection can be a part of the backbone of the first polymer and/or the second polymer. In one embodiment, the moiety that facilitates deprotection can be a substituent on the backbone of the first polymer and/or the second polymer.

In one embodiment, the second polymer is a homopolymer that is derived from the polymerization of either 1-ethylcyclopentyl methacrylate (ECPMA), γ-butyrolactone-2-yl methacrylate (GBLMA), hydroxystyrene, N-phenyl maleimide, or triphenylsulfonium 1,1-difluoro-2-(methacryloxy)ethanesulfonate (TPS-DFSEMA). In an exemplary embodiment, the second polymer is a homopolymer that comprises poly(1-ethylcyclopentyl methacrylate). The second polymer comprising a homopolymer poly(1-ethylcyclopentyl methacrylate) has the structure shown in the formula (2) below:

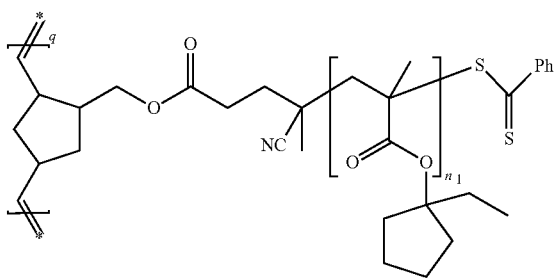

(2), where q is 5 to 50, specifically 20 to 45, and where $n_1$ is 5 to 25, specifically 7 to 20.

In another embodiment, the second polymer can be a diblock copolymer that is derived from the copolymerization of any two of 1-ethylcyclopentyl methacrylate, γ-butyrolactone-2-yl methacrylate, hydroxystyrene, N-phenyl maleimide and triphenylsulfonium 1,1-difluoro-2-(methacryloxy) ethanesulfonate. In an exemplary embodiment, the diblock copolymer comprises poly(1-ethylcyclopentyl methacrylate) and poly(γ-butyrolactone-2-yl methacrylate). When the second polymer is a copolymer of poly(1-ethylcyclopentyl methacrylate) and poly(γ-butyrolactone-2-yl methacrylate), the molar ratio of poly(1-ethylcyclopentyl methacrylate) to poly(γ-butyrolactone-2-yl methacrylate) is 1:6 to 6:1, specifically 1:3 to 3:1, and more specifically 1:2 to 2:1. In an exemplary embodiment, the molar ratio of poly(1-ethylcyclopentyl methacrylate) to poly(γ-butyrolactone-2-yl methacrylate) in the second polymer is 1.5:1 to 1:1.5.

The second block graft comprising a polynorbornene backbone to which is grafted the second polymer that comprises poly(1-ethylcyclopentyl methacrylate) and poly(γ-butyrolactone-2-yl methacrylate) has the structure shown below in the formula (3)

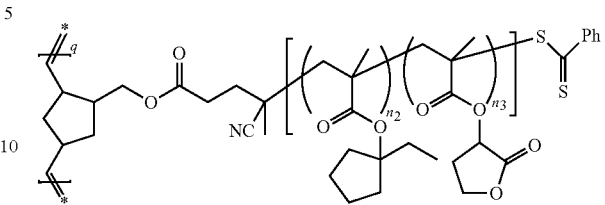

(3), where q is 5 to 50, preferably 10 to 45, where $n_2$ is 5 to 40, preferably 15 to 35 and where $n_3$ is 5 to 50, preferably 25 to 40.

In yet another exemplary embodiment, the diblock copolymer comprises poly(1-ethylcyclopentyl methacrylate) and poly(triphenylsulfonium 1,1-difluoro-2-(methacryloxy)ethanesulfonate). When the second polymer is a copolymer of poly(1-ethylcyclopentyl methacrylate) and poly(triphenylsulfonium 1,1-difluoro-2-(methacryloxy)ethanesulfonate), the molar ratio of poly(1-ethylcyclopentyl methacrylate) to poly(triphenylsulfonium 1,1-difluoro-2-(methacryloxy)ethanesulfonate) is 1:6 to 6:1, specifically 1:3 to 3:1, and more specifically 1:2 to 2:1. In an exemplary embodiment, the molar ratio of poly(1-ethylcyclopentyl methacrylate) to poly(triphenylsulfonium 1,1-difluoro-2-(methacryloxy)ethanesulfonate) in the second polymer is 3.5:1 to 1:3.5.

The second block graft copolymer comprising a polynorbornene backbone to which is grafted the second polymer that comprises poly(1-ethylcyclopentyl methacrylate) and poly(triphenylsulfonium 1,1-difluoro-2-(methacryloxy)ethanesulfonate) has a structure shown below in the formula (4)

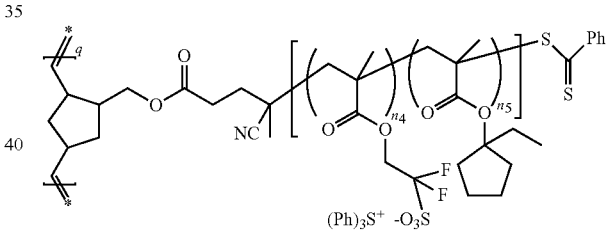

(4) where q is 3 to 50, specifically 4 to 45, where $n_4$ is 3 to 10, specifically 4 to 9 and where $n_5$ is 5 to 30, specifically 7 to 25. In an exemplary embodiment in the formula (4), q is 30, while $n_4$ is 4 and $n_5$ is 14.

In yet another exemplary embodiment, the second polymer is a copolymer of BOC-protected poly(hydroxy styrene) (where BOC refers to a tertiary-butoxycarbonyl protecting group) and poly(N-phenyl maleimide) denoted by BOC-protected poly(para-hydroxy styrene-co-N-phenyl maleimide). When the second polymer is a copolymer of BOC-protected poly(hydroxy styrene) and poly(N-phenyl maleimide) denoted by BOC-protected poly(para-hydroxy styrene-co-N-phenyl maleimide), the poly(hydroxy styrene), the molar ratio of poly(N-phenyl maleimide) to BOC-protected poly(para-hydroxy styrene-co-N-phenyl maleimide) is 1:6 to 6:1, specifically 1:3 to 3:1, and more specifically 1:2 to 2:1. In an exemplary embodiment, the molar ratio of poly(N-phenyl maleimide) to BOC-protected poly(para-hydroxy styrene-co-N-phenyl maleimide) in the second polymer is 1:1. The second block graft comprises a polynorbornene backbone to which is grafted the second polymer that comprises BOC-protected poly(para-hydroxy styrene-co-N-phenyl maleimide) and has the structure in the formula (5) below:

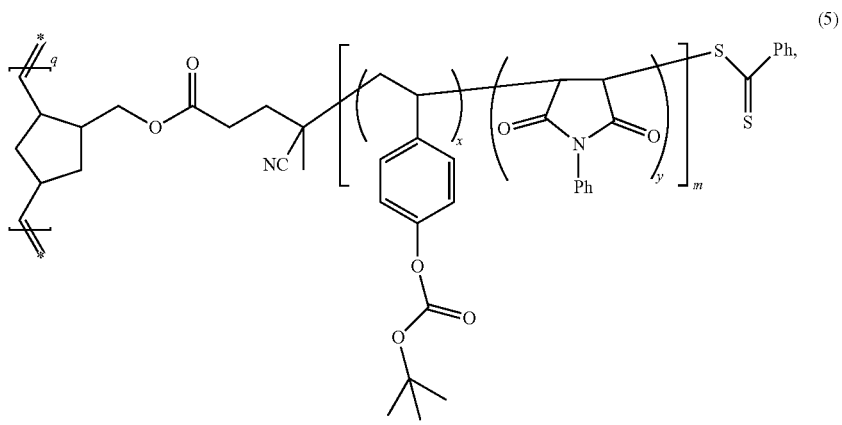

(5)

where m is 10 to 40, x is 0.25 to 1, y is 0.25 to 1 and p is 3 to 75.

In yet another embodiment, the second polymer can be a terpolymer that is derived from the copolymerization of any three of 1-ethylcyclopentyl methacrylate, γ-butyrolactone-2-yl methacrylate, BOC-protected hydroxystyrene, N-phenyl maleimide and triphenylsulfonium 1,1-difluoro-2-(methacryloxy)ethanesulfonate. In an exemplary embodiment, the second polymer can comprise a terpolymer that comprises poly(1-ethylcyclopentyl methacrylate), poly(triphenylsulfonium 1,1-difluoro-2-(methacryloxy)ethanesulfonate) and poly(γ-butyrolactone-2-yl methacrylate). The molar ratio of poly(1-ethylcyclopentyl methacrylate) to poly(triphenylsulfonium 1,1-difluoro-2-(methacryloxy)ethanesulfonate) to poly(γ-butyrolactone-2-yl methacrylate) is 1:1:10 to 10:1:10. The molar ratio of poly(1-ethylcyclopentyl methacrylate) to poly(triphenylsulfonium 1,1-difluoro-2-(methacryloxy)ethanesulfonate) to poly(γ-butyrolactone-2-yl methacrylate) is 3:3:10 to 10:1:10.

The second block graft comprising the polynorbornene backbone to which is grafted the second polymer that comprises poly(1-ethylcyclopentyl methacrylate), poly(triphenylsulfonium 1,1-difluoro-2-(methacryloxy)ethanesulfonate) and poly(γ-butyrolactone-2-yl methacrylate) is shown below in the formula (6)

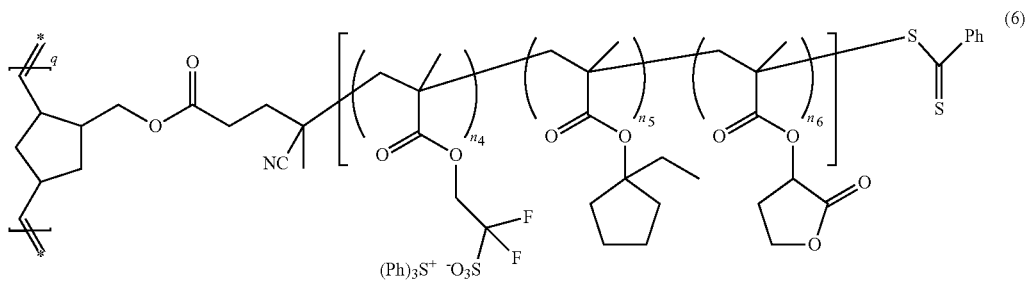

(6)

where q is 3 to 50, specifically 4 to 45, where $n_4$ is 3 to 10, specifically 4 to 9 and where $n_5$ is 5 to 30, specifically 7 to 25 and where $n_6$ is 5 to 50. In an exemplary embodiment in the formula (4), q is 20, while $n_4$ is 4, $n_5$ is 14 and $n_6$ is 15.

In yet another embodiment, the second polymer can comprise two diblock copolymers—a first diblock copolymer and a second diblock copolymer, where the first diblock copolymer comprises two blocks that are derived from the copolymerization of any two of 1-ethylcyclopentyl methacrylate, γ-butyrolactone-2-yl methacrylate, BOC-protected hydroxystyrene, N-phenyl maleimide and triphenylsulfonium 1,1-difluoro-2-(methacryloxy)ethanesulfonate and where the second diblock copolymer is different from the first diblock copolymer and is derived from the copolymerization of any two of 1-ethylcyclopentyl methacrylate, γ-butyrolactone-2-yl methacrylate, BOC-protected hydroxystyrene, N-phenyl maleimide and triphenylsulfonium 1,1-difluoro-2-(methacryloxy)ethanesulfonate. In an exemplary embodiment, the first diblock is derived from the copolymerization of triphenylsulfonium 1,1-difluoro-2-(methacryloxy)ethanesulfonate and 1-ethylcyclopentyl methacrylate, while the second diblock is derived from the copolymerization of 1-ethylcyclopentyl methacrylate and γ-butyrolactone-2-yl methacrylate.

The second block graft comprising the polynorbornene backbone to which is grafted the second polymer that comprises the first diblock derived from the copolymerization of triphenylsulfonium 1,1-difluoro-2-(methacryloxy)ethanesulfonate and 1-ethylcyclopentyl methacrylate and the second diblock derived from the copolymerization of 1-ethylcyclopentyl methacrylate and γ-butyrolactone-2-yl methacrylate is shown below in the formula (7)

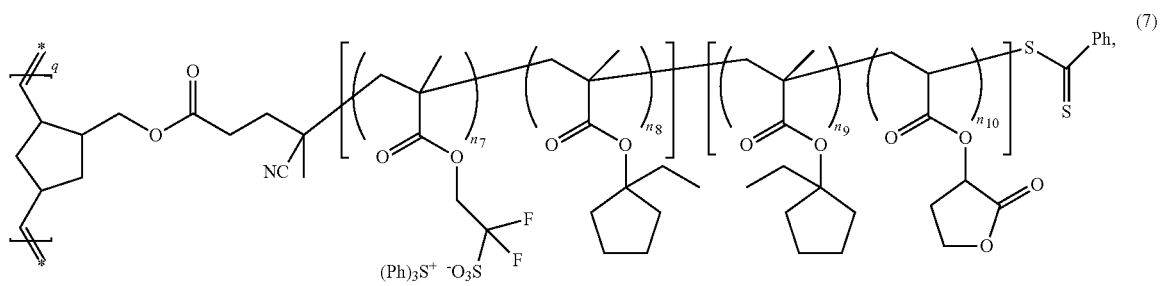

where q has a value of 10 to 40, specifically 15 to 25, $n_7$ is 2 to 10, $n_8$ is 10 to 30, $n_9$ is 5 to 20 and $n_{10}$ is 5 to 20.

In yet another embodiment, the second polymer can be a quadrapolymer that is derived from the copolymerization of any four of 1-ethylcyclopentyl methacrylate, γ-butyrolactone-2-yl methacrylate, BOC-protected hydroxystyrene, N-phenyl maleimide and triphenylsulfonium 1,1-difluoro-2-(methacryloxy)ethanesulfonate.

In one embodiment, it is desirable for the second polymer (e.g., the copolymer of protected-polyhydroxystyrene and poly(N-phenylene maleimide, the copolymer of poly(1-ethylcyclopentyl methacrylate) and poly(triphenylsulfonium 1,1-difluoro-2-(methacryloxy)ethanesulfonate or the copolymer of poly(1-ethylcyclopentyl methacrylate and poly(γ-butyrolactone-2-yl methacrylate) to have a water contact angle of 15 to 80 degrees. In an exemplary embodiment, it is desirable for the second polymer to have a preferred water contact angle of 45 to 65 degrees. The second polymer generally has a total number of repeat units of 6 to 95, preferably 12 to 80, and more preferably 14 to 60 when measured using gel permeation chromatography (GPC). In one embodiment, the second polymer has a number average molecular weight of 1,850 to 13,000 Daltons when measured using GPC. The second polymer has a PDI of 1.05 to 1.30, preferably 1.05 to 1.15 as determined by GPC.

Sequential grafting through polymerizations of first and second block polymers establish the graft block copolymers having the structures of the formulas (8)-(10) below:

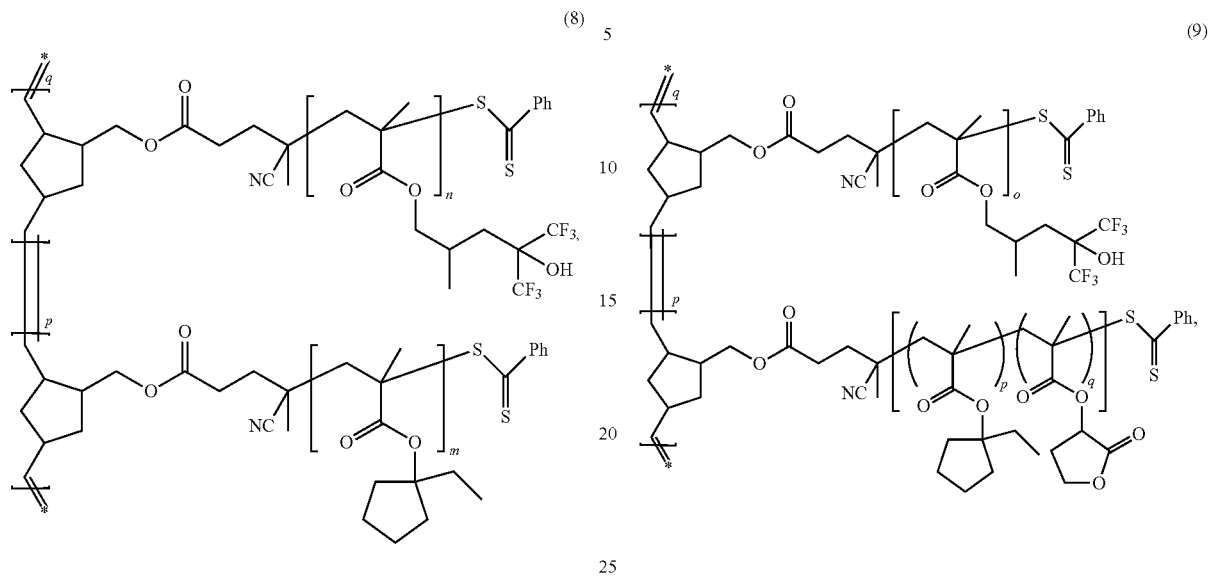
where p is 30 to 70, q is 3 to 20, n is 10 to 25 and m is 10 to 20; or
where p is 30 to 70, q is 3 to 20, o is 10 to 25, p is 10 to 20, and q is 25 to 35; or
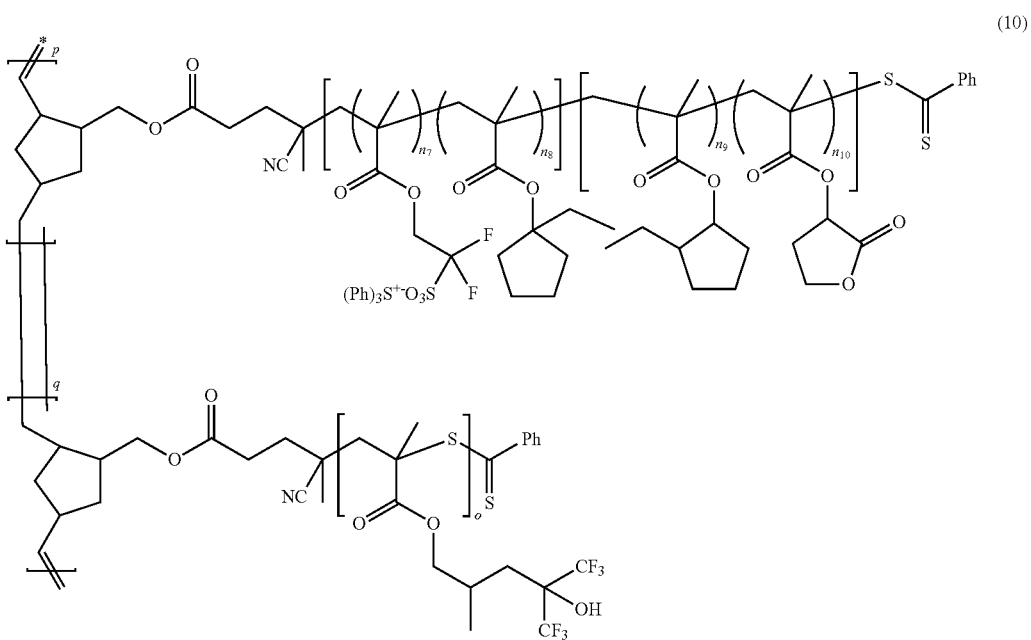

where p is 10 to 30, q is 2 to 8, $n_7$ is 2 to 6, $n_8$ is 10 to 20, $n_9$ is 10 to 20, $n_{10}$ is 7 to 15 and o is 12 to 25. As can be seen in the formulas (8)-(10) above, the number of repeat units of the norbornene backbone of the first block (the block polymer that contains the fluorinated (meth)acrylics or fluorinated (meth)acrylates) is less than the number of repeat units of the norbornene backbone of the second block.

The copolymer of the formulas (8)-(10) can be manufactured in a batch process or in a continuous process. The batch process or the continuous process can involve a single or multiple reactors, single or multiple solvents and single or multiple catalysts (also termed initiators).

In one embodiment, in one method of producing the graft block copolymer, the first block polymer is synthesized separately from the second block polymer. The first block polymer is covalently bonded to the second block polymer to form the graft block copolymer.

The first block is manufactured by reacting a precursor to the backbone polymer with a chain transfer agent to form backbone polymer precursor-chain transfer agent moiety in a first reactor. The backbone polymer precursor-chain transfer agent moiety is then reacted with a precursor to the first polymer to form the first polymer using reversible addition-fragmentation chain transfer (RAFT) polymerization. The first polymer is covalently bonded to the precursor of the backbone polymer during the RAFT polymerization, which is conducted in the first reactor in the presence of a first solvent and a first initiator. The precursor to the backbone polymer is then polymerized via ring opening metathesis polymerization (ROMP) to form the first block polymer. The ROMP reaction may be conducted in the first reactor or in another reactor. The first block polymer comprises the backbone polymer with the first polymer grafted onto it. This first block polymer may be disposed upon a substrate to produce a self-assembled film without copolymerizing it to the second block. The film can then be reacted using radiation.

The second block polymer may be polymerized in a second reactor if desired. A precursor to the backbone polymer is reacted with a chain transfer agent to form a backbone polymer precursor-chain transfer agent moiety. The backbone polymer precursor-chain transfer agent moiety is then reacted with the precursor(s) to the second polymer to form the second polymer using reversible addition-fragmentation chain transfer (RAFT) polymerization. The second polymer (which as noted above may be a homopolymer or a copolymer) is covalently bonded to the backbone polymer precursor-chain transfer agent moiety during the RAFT polymerization, which is conducted in the presence of a second solvent and a second initiator. When the second polymer is a copolymer, there are two or more precursors that are reacted together with the precursor to the backbone polymer to form the second graft polymer. The precursor to the second polymer is then polymerized via a second ring opening metathesis polymerization (ROMP) to form the second block polymer. The second block polymer comprises the backbone polymer with the second polymer grafted onto it. In the production of the first and the second block polymers, the first reactor may be the same as the second reactor, the first solvent may be the same as the second solvent and the first initiator may be the same as the second initiator. In one embodiment, the first reactor may be different from the second reactor, the first solvent may be different from the second solvent and the first initiator may be different from the second initiator.

In one embodiment, the first block polymer is reacted with the second block polymer in a second ring opening metathesis polymerization to form the graft block copolymer. The second ring opening metathesis polymerization may be conducted in either the first reactor, the second reactor or in a third reactor. The graft block copolymer is then purified by a variety of different methods that are listed below. It may then be disposed upon a substrate to produce a higher degree of self-assembly than the self-assembly produced by disposing either the first block polymer or the second block polymer by themselves on the substrate.

The first polymer is produced by reacting the norbornene with a dithioester chain transfer agent to produce a norbornene-chain transfer agent moiety. The norbornene-chain transfer agent moiety is then reacted with 5,5,5-trifluoro-4-hydroxy-2-methyl-4-(trifluoromethyl)pentyl methacrylate in a first reactor to produce the first polymer. The reaction is demonstrated in reaction scheme (1) below.

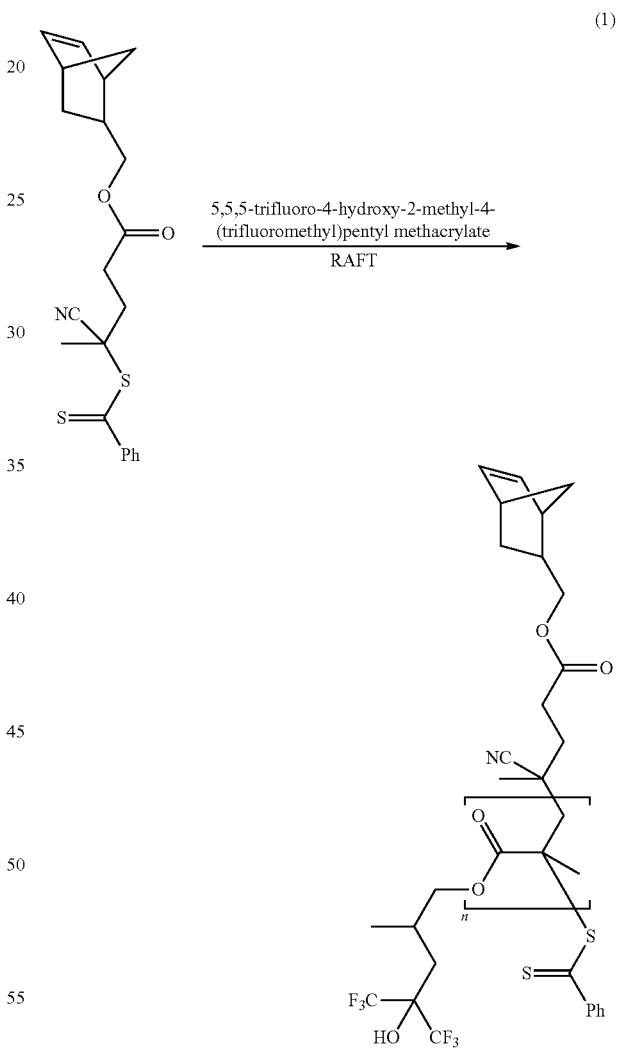

(1)

The reaction (1) above may be conducted in a first solvent. The solvent may be chosen from a list of solvents mentioned below. The weight ratio of the solvent to the monomers is about 1:1 to about 10:1, specifically about 2:1 to about 6:1, and more specifically about 3:1 to about 4:1. In an exemplary embodiment, the second solvent is 2-butanone. An initiator may be used to initiate the second RAFT reaction. The initiators disclosed below may be used for the second RAFT reaction.

The initiator (for the preparation of the first polymer) is used in molar ratio of 0.02 to 0.3 with respect to the norbornene-chain transfer agent. In an exemplary embodiment, the initiator is used in molar ratio of 0.06 to 0.15 with respect to the norbornene-chain transfer agent.

The first RAFT reaction between the norbornene-chain transfer agent and the poly(5,5,5-trifluoro-4-hydroxy-2-methyl-4-(trifluoromethyl)pentyl methacrylate) to form the first polymer is conducted in the first reactor under agitation and at a temperature of 50 to 80° C., preferably 60 to 70° C., and more preferably 62 to 67° C. In an exemplary embodiment, the first RAFT reaction is conducted at a temperature of 65° C. The first polymer may be purified after its preparation by precipitation, washing, distillation, decanting, centrifugation, or the like. In an exemplary embodiment, the first polymer is purified by precipitation in hexane.

In an exemplary embodiment, when the backbone polymer is polynorbornene, when the first polymer is derived from the polymerization of 5,5,5-trifluoro-4-hydroxy-2-methyl-4-(trifluoromethyl)pentyl methacrylate (as detailed above), the second polymer comprises a first block polymer that comprises blocks of poly(1-ethylcyclopentyl methacrylate) and poly(triphenylsulfonium 1,1-difluoro-2-(methacryloxy)ethanesulfonate) and a second block that comprises poly(1-ethylcyclopentyl methacrylate and poly(γ-butyrolactone-2-yl methacrylate).

The second polymer is produced by reacting the norbornene with a dithioester chain transfer agent to produce a norbornene-chain transfer agent moiety. The norbornene-chain transfer agent moiety is then reacted with triphenylsulfonium 1,1-difluoro-2-(methacryloxy)ethanesulfonate and 1-ethylcyclopentyl methacrylate in a first RAFT reaction to copolymerize the poly(triphenylsulfonium 1,1-difluoro-2-(methacryloxy)ethanesulfonate) and poly(1-ethylcyclopentyl methacrylate) to form the norbornene-poly(5 triphenylsulfonium 1,1-difluoro-2-(methacryloxy)ethanesulfonate)-co-(1-ethylcyclopentyl methacrylate)) copolymer (i.e., the first block polymer of the first polymer). The reaction is demonstrated in reaction scheme (2) below.

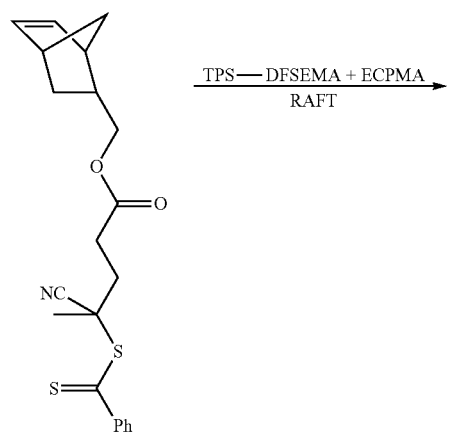

(2)

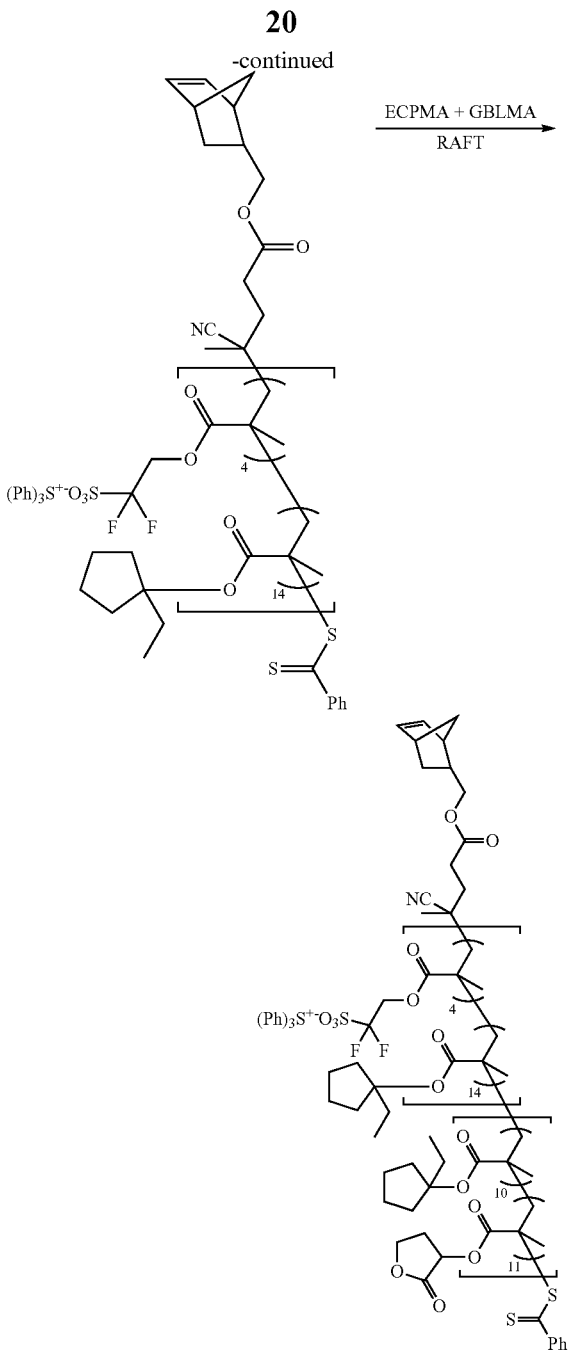

The reaction scheme (1) above may be conducted in a first solvent, while the reaction scheme (2) may be conducted in a second solvent. In one embodiment, the first solvent is the same as the second solvent. Suitable solvents for conducting the reaction are polar solvents, non-polar solvents, or combinations thereof. Examples of solvents are aprotic polar solvents, polar protic solvents, or non-polar solvents. In one embodiment, aprotic polar solvents such as propylene carbonate, ethylene carbonate, butyrolactone, acetonitrile, benzonitrile, nitromethane, nitrobenzene, sulfolane, dimethylformamide, N-methylpyrrolidone, 2-butanone, acetone, hexanone, acetylacetone, benzophenone, acetophenone, or the like, or combinations comprising at least one of the foregoing solvents may be used. In another embodiment, polar protic solvents such as water, methanol, acetonitrile, nitromethane, ethanol, propanol, isopropanol, butanol, or the like, or combinations comprising at least one of the foregoing polar protic solvents may also be used. Other non-polar solvents such as benzene, alkylbenzenes (such as toluene or xylene), methylene chloride, carbon tetrachloride, hexane, diethyl ether, tetrahydrofuran, 1,4-dioxane, or the like, or combinations comprising at least one of the foregoing solvents may also be used. Co-solvents comprising at least one aprotic polar solvent and at least one non-polar solvent may also be utilized to modify the swelling power of the solvent and thereby adjust the rate of reaction. In an exemplary embodiment, the first solvent is 2-butanone. It is desirable to use anhydrous solvent for conducting the reaction.

The weight ratio of the solvent to the combined weight of the TFS-DFSEMA and ECPMA is about 1:1 to about 5:1, specifically about 1.5:1 to about 3:1, and more specifically about 1.6:1 to about 2:1.

A first initiator may be used to initiate the first RAFT reaction. Examples of suitable initiators are azobisisobutyronitrile (AIBN), 4,4'-azobis(4-cyanovaleric acid) (ACVA), also called 4,4'-azobis(4-cyanopentanoic acid), di-tert-butyl peroxide (tBuOOtBu), benzoyl peroxide ((PhCOO)$_2$), methyl ethyl ketone peroxide, tert-amyl peroxybenzoate, dicetyl peroxydicarbonate, or the like or a combination comprising at least one of the foregoing initiators. The first initiator may also be a radical photoinitiator. Examples are benzoyl peroxide, benzoin ethers, benzoin ketals, hydroxyacetophenone, methylbenzoyl formate, anthroquinone, triarylsulfonium hexafluorophosphate salts, triarylsulfonium hexafluoroantimonate salts, phosphine oxide compounds such as Irgacure 2100 and 2022 (sold by BASF), or the like, or a combination comprising at least one of the foregoing radical initiators.

The initiator is used in molar ratio of 0.02 to 0.3 with respect to the norbornene-chain transfer agent. In an exemplary embodiment, the initiator is used in molar ratio of 0.07 to 0.18 with respect to the norbornene-chain transfer agent. The first RAFT reaction between the norbornene-chain transfer agent and the 5,5,5-trifluoro-4-hydroxy-2-methyl-4-(trifluoromethyl)pentyl methacrylate) to form the first polymer is conducted in the first reactor under agitation and at a temperature of 50 to 80° C., preferably 60 to 70° C. In an exemplary embodiment, the first RAFT reaction is conducted at a temperature of 65° C. The first polymer may be purified after its preparation by precipitation, washing, distillation, decanting, centrifugation, or the like. In an exemplary embodiment, the first polymer is purified by precipitation in hexane.

Following the formation of the norborne-poly(triphenylsulfonium 1,1-difluoro-2-(methacryloxy)ethanesulfonate)-co-(1-ethylcyclopentyl methacrylate)) copolymer, the second block comprising the copolymer of poly(1-ethylcyclopentyl methacrylate and poly(γ-butyrolactone-2-yl methacrylate) is synthesized using another RAFT reaction to form the second polymer as detailed in the reaction scheme (2) above.

The first polymer prepared via the reaction scheme (1) and the second polymer prepared via the reaction (2) are then subjected to the ring opening metathesis polymerization reaction (3) to convert the norbornene to polynorbornene and to form the graft block copolymer. The reaction may be conducted in the first reactor, the second reactor or in a third reactor that is independent from the first two reactors. The reactors should be cleaned out prior to the reaction. The reaction is conducted in the presence of a modified Grubbs catalyst. The Grubbs catalyst may be a first generation Grubbs catalyst, a second generation Grubbs catalyst, a Hoveyda-Grubbs catalyst, or the like, or a combination comprising at least one of the foregoing Grubbs catalyst. The Grubbs catalyst may be a fast initiating catalyst if desired.

An exemplary modified Grubbs catalyst is shown in formula (11).

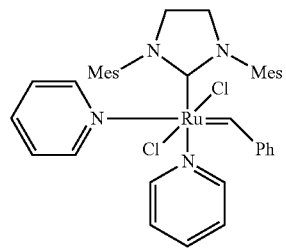

(11) where Mes represents mesitylene or 1,3,5-trimethylbenzene.

The molar ratio of the Grubbs catalyst to the first polymer is 1:1 to 1:20. In an exemplary embodiment, the molar ratio of the Grubbs catalyst to the first polymer is 1:4. The molar ratio of the Grubbs catalyst to the second polymer is 1:1 to 1:100. In an exemplary embodiment, the molar ratio of the Grubbs catalyst to the second polymer is 1:30. In the reaction (3), the molar ratio of the first polymer to the second polymer is 1:2 to 1:20. In an exemplary embodiment, in the reaction scheme (3), the molar ratio of the first polymer to the second polymer is 1:7.

In one embodiment, in one method of preparing the graft block copolymer, the catalyst is first added to the reactor with a solvent and the mixture is agitated to obtain a homogeneous solution. The first polymer and the second polymer are then sequentially added to the reactor. The reactor is agitated for a period of 1 to 5 hours. The polymerization was then quenched with a quencher. An exemplary quencher is ethyl vinyl ether. The graft block copolymer is then purified.

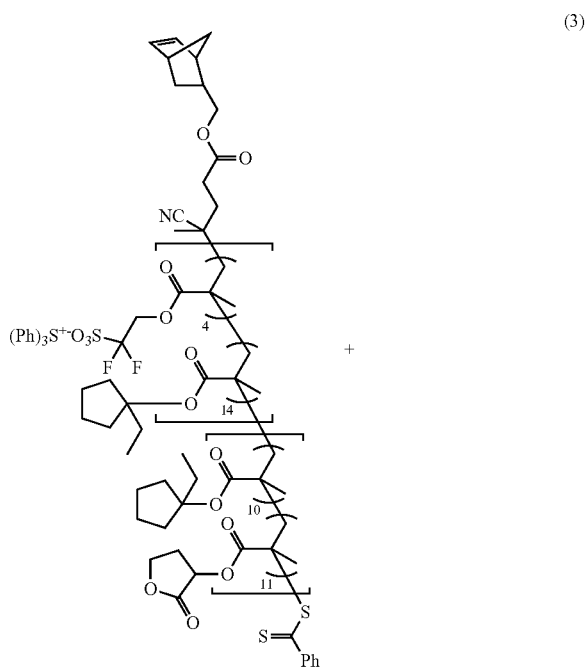

(3)

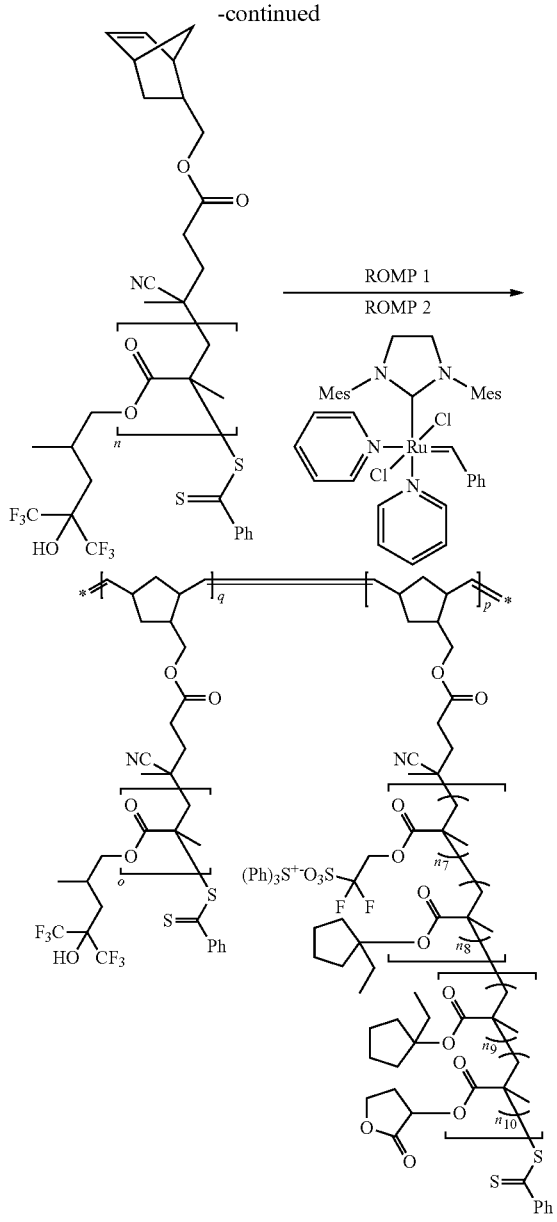

As noted above, the first polymer, the second polymer and the graft block copolymer may be purified by a variety of methods. Purification of the respective polymers is optional. The reactants, the respective polymers, and the graft block copolymer may be purified prior to and/or after the reaction. Purification may include washing, filtration, precipitation, decantation, centrifugation, distillation, or the like, or a combination comprising at least one of the foregoing methods of purification.

In one exemplary embodiment, all reactants including the solvents, initiators, endcapping agents and quenchers are purified prior to the reaction. It is generally desirable to use reactants, solvents and initiators that are purified to an amount of greater than or equal to about 90.0 wt % purity, specifically greater than or equal to about 95.0 wt % purity and more specifically greater than or equal to about 99.0 wt % purity. In another exemplary embodiment, after polymerization of the graft block copolymer, it may be subjected to purification by methods that include washing, filtration, precipitation, decantation, centrifugation or distillation. Purification to remove substantially all metallic impurities and metallic catalyst impurities may also be conducted. The reduction of impurities reduces ordering defects when the graft block copolymer is annealed, and reduces defects in integrated circuits used in electronic devices.

In one embodiment, the copolymer may contain antioxidants, anti-ozonants, mold release agents, thermal stabilizers, levelers, viscosity modifying agents, free-radical quenching agents, crosslinking agents, photo acid generators, dyes, bleachable dyes, photosensitizers, metal oxide nanoparticles, conductive fillers, non-conductive fillers, thermally conductive fillers, other polymers or copolymers such as impact modifiers, or the like.

The graft block copolymer after purification may be used to manufacture a photoresist composition. The photoresist composition comprises the graft block copolymer, a solvent, a quencher and a photoacid generator. In one embodiment, the graft block copolymer may be dissolved in a solvent along with a photo acid generator and then disposed upon the surface of a substrate to form a graft block copolymer film that displays order in one or more directions, preferably in two or more directions and more preferably in three or more directions. In one embodiment, these directions are mutually perpendicular to each other.

The graft block copolymer disposed upon the surface of the substrate undergoes self-assembly in the form of bottle-brushes on the surface of the substrate. In one embodiment, when the copolymer comprises only a single block (i.e., either the first block polymer or the second block polymer), the brushes may self-assemble in only two dimensions on the surface of the substrate, i.e., the backbone polymers may not be oriented with their backbones disposed perpendicular to the surface of the substrate.

When the copolymer comprises two blocks (i.e., it is a graft block copolymer) and when one block copolymer comprises the surface energy reducing moiety, the brushes self-assemble in such a manner so that the backbone polymer is oriented substantially perpendicular to the surface of the substrate, while the first and second polymers extend radially outwards from the backbone polymer. The first and second polymers are substantially parallel to the surface of the substrate, when the backbone polymer is disposed substantially perpendicular to the surface of the substrate. This morphology is termed the vertical oriented bottle-brush morphology.

In one embodiment, when a monolayer of the graft block copolymer is disposed on a substrate, the individual polymer chains align with their backbones disposed substantially perpendicular to the substrate and the graft polymers extend radially outwards from the backbone. When two or more layers are disposed on the substrate, the bottle-brushes of the second layer may be inter-digitated with the bottle brushes of the first monolayer.

Figure 2:
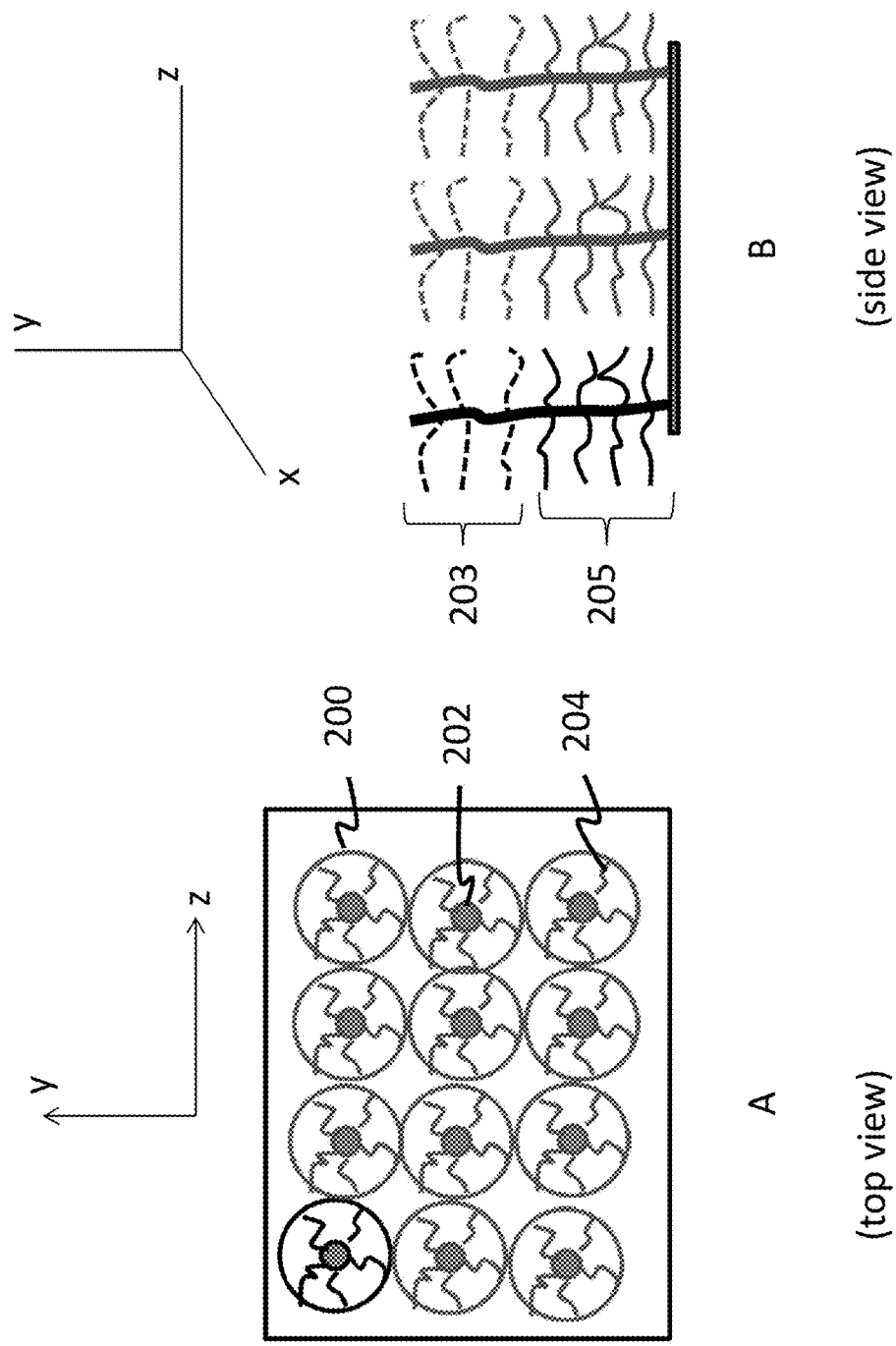
FIGS. 2A and 2B is a schematic depiction of an exemplary ordering that occurs when the brush polymer having a surface energy reducing moiety is disposed upon a substrate.

In one embodiment, the presence of the fluorine atoms in the copolymer promotes the self-assembly of the brushes in three directions. Since the fluorine atom reduces the surface energy of the terpolymer, it facilitates an orientation of the terpolymer with the first block (the block that contains the fluorine atoms) located at the farthest end of the copolymer from the substrate. The FIGS. 2A and 2B display a top view and a side view respectively of the terpolymer that contains a polymer backbone 202, with the first polymer 204 grafted onto the backbone. The FIG. 2A (which represents the top view) shows that the brushes self-assemble to display order in two mutually perpendicular directions (y and z, which are in the plane of the substrate), while the FIG. 2B (which represents the side view) shows order in the third direction (the x-direction, which is perpendicular to the plane of the substrate). In the FIGS. 2A and 2B, the backbone polymer 200 has grafted onto it both the first polymer 203 (which comprises the surface energy reducing moiety) and the second polymer 205 (which does not contain a surface energy reducing moiety) and the presence of the surface energy reducing moiety produces order in three mutually directions. The order is reflected by the periodicity of the structures shown in the FIGS. 2A and 2B. The periodicity of the structures could be in either planar ordered arrays such as square packed or hexagonal close packed (hcp) arrays, or the packing arrangement can have various degrees of packing disorder, or the packing arrangement can be disordered, or the packing could occur with the graft polymers interdigitated to various degrees. Compression and extension of the first and second polymers allows for planar packing of the bottle brush structures to conform and adjust to the local enthalpic and entropic energetic requirements in the packed film state. When the terpolymer does not contain the surface energy reducing moiety (e.g., fluorine atoms), the self-assembly in the x-direction, which is perpendicular to the plane of the substrate, does not take place as completely, and thus a number of the terpolymers within the film often lie flat in the y and z direction.

The graft block copolymer may be disposed upon the substrate by a variety of methods such as spray painting, spin casting, dip coating, brush coating, application with a doctor blade, or the like.

In one embodiment, a photoresist composition comprising the graft block copolymer and a photo acid generator may first be mixed (blended) and applied to the substrate to form a self-assembled film. The film is then dried to remove solvents. The resultant film thickness can be measured by a variety of techniques including ellipsometry, AFM, and SEM. When the bottle brush terpolymers are substantially self-assembled in the x-direction, which is perpendicular to the plane of the substrate, and if the casting solution is sufficiently dilute and the spin speed is adjusted so that the substrate if coated with a monolayer of terpolymer chains, the film thickness will be approximately the length of the terpolymer backbone. The film is subjected to radiation to generate acid and treated to post-exposure baking to deprotect the acid-cleavable moieties on the terpolymer. The patterned film may be used as a photoresist after baking and further developing. The exposed portion of the film will undergo deprotection, which may then be removed using an aqueous base solvent, leaving behind a patterned positive tone film. A portion of the film may be protected from the radiation with a mask and this portion will not undergo any significant deprotection. The portions of the film which retain a majority of the protecting moieties may then be removed using an organic solvent leaving behind a patterned negative tone film.

In one embodiment, a photoresist composition comprising the graft block copolymer, and a photoacid generator may first be applied to the substrate to form a self-assembled film. The film is then dried to remove solvents. The film is subjected to electron beam radiation to form a photoacid, followed by an optional bake step to deprotect the functional moieties on the terpolymers. A portion of the film may be free from irradiation by either not directing the electron beam over this portion of the film, or with a mask. This unirradiated portion will not undergo significant deprotection of acid cleavable moieties when followed by an optional bake step. The deprotected portions of the film may then be removed using an aqueous alkaline developer, leaving behind a patterned film with a positive tone. The patterned film may be used as a photoresist after baking and further developing.

An exemplary photoacid generator (PAG) is triphenylsulfonium nonafluorobutyl sulfonate.

In the photoresist composition, the copolymer is used in amounts of 50 to 80 wt %, the photoacid generator is used in amounts of 5 to 25 wt % and based on the total weight of the photoresist composition. If the photoresist composition contains covalently bonded acid generating groups, the amount of added additional free photoacid generator molecule is used in amounts of 0 to 15 wt %. The photoresist composition may contain solvents if desired.

In one embodiment, the graft block copolymer may be used to selectively interact, or pin, a domain of the block copolymer that is disposed upon the graft block copolymer to induce order and registration of the block copolymer morphology. The graft block copolymer has a topology that can induce alignment and registration of one or more of the domains of the block copolymer.

The graft block copolymer can be used as a template to decorate or manufacture other surfaces that may be used in fields such as electronics, semiconductors, and the like. The graft block copolymer has a number of significant advantages over other block copolymers that can self-assemble and that are used in the formation of photoresists. By using graft block copolymers where a high degree of control is exerted over the synthetic chemistry, large-areas of vertical alignment of the graft block copolymer are achieved in films having a thickness of less than 50 nanometers (nm), preferably less than 30 nm, without the need for supramolecular assembly processes as are required for other comparative forms of linear block copolymer lithography. The structural and morphological features of the graft block copolymers can be tuned in the lateral and longitudinal directions thus enabling the preparation of high-sensitivity photoresists. Furthermore, the structural and morphological features of the graft block copolymers can be tuned in the lateral and longitudinal directions to facilitate an enhanced anisotropic vertical diffusion of photoacid catalyst. These photoresists (each comprising only a few graft block copolymers) can be used for photolithography in conjunction with high energy electromagnetic radiation (e.g., X-ray, electron beam, neutron beam, ionic radiation, extreme ultraviolet (having photons with energies from 10 eV up to 124 eV), and the like) with line-width resolutions of less than or equal to about 30 nm. The graft block copolymer, the photoresist composition and the photoresists derived therefrom are detailed in the following non-limiting examples.

EXAMPLE

This example is conducted to demonstrate the preparation of the graft block copolymer. The first block comprises a polynorbornene backbone polymer to which is grafted the first polymer—a poly(5,5,5-trifluoro-4-hydroxy-2-methyl-4-(trifluoromethyl)pentyl methacrylate) (as detailed above), the second block comprises a polynorbornene backbone polymer to which is grafted the second polymer—a first block polymer that comprises blocks of poly(1-ethylcyclopentyl methacrylate) and poly(triphenylsulfonium 1,1-difluoro-2-(methacryloxy)ethanesulfonate) and a second block that comprises poly(1-ethylcyclopentyl methacrylate and poly(γ-butyrolactone-2-yl methacrylate).

The materials used for the production of the graft block copolymer are as follows:

The modified Grubbs catalyst and the norbornene-chain transfer agents (NB-CTA) were synthesized according to the literature reports provided in the following references:
1. Li, Z.; Ma, J.; Lee, N. S.; Wooley, K. L. *J. Am. Chem. Soc.* 2011, 133, 1228.
2. Li, A.; Ma, J.; Sun, G.; Li, Z.; Cho, S.; Clark, C.; Wooley, K. L. *J. Polym. Sci., Part A: Polym. Chem.* 2012, 50, 1681.

The photoacid generators (PAGs)—triphenylsulfonium hexafluoroantimonate for photolithography, and triphenylsulfonium perfluoro-1-butanesulfonate for electron beam lithography (EBL), respectively, were provided by DOW Electronic Materials. The ECPMA and GBLMA were provided by DOW Electronic Materials and were purified by column chromatography to remove the inhibitors. The hydroxyl-terminated polystyrenes (PS-OHs, molecular weight 4,000 Daltons and 10,000 Daltons by GPC, respectively) were provided by DOW Electronic Materials. The 1,1,1-trifluoro-2-(trifluoromethyl)-2-hydroxy-4-methyl-5-pentyl methacrylate (BTFHMBMA) was purchased from Aldrich and was used without further purification. The triphenylsulfonium 1,1-difluoro-2-(methacryloxy)ethanesulfonate (TPS-DFSEMA) was provided by DOW Electronic Materials and was used without further purification. Other chemicals were purchased from Aldrich, Acros, and VWR and were used without further purification unless otherwise noted. Prior to use, tetrahydrofuran (THF) was distilled over sodium and stored under $N_2$. Dichloromethane ($CH_2Cl_2$) was distilled over calcium hydride and stored under nitrogen.

The instruments used for the analysis of the precursors and the products are detailed as follows: $^1H$ and $^{13}C$ NMR spectra were recorded on a Varian 500 MHz spectrometer interfaced to a UNIX computer using VNMR software. Chemical shifts were referred to the solvent proton resonance.

The polymer molecular weight and molecular weight distribution were determined by Gel Permeation Chromatography (GPC). The GPC was conducted on a Waters 1515 HPLC (Waters Chromatography, Inc.) equipped with a Waters 2414 differential refractometer, a PD2020 dual-angle (15° and 90°) light scattering detector (Precision Detectors, Inc.), and a three-column series (PL gel 5 micrometer (µm) Mixed C, 500 Angstroms (Å), and $10^4$ Å, 300×7.5 millimeters (mm) columns; Polymer Laboratories, Inc.). The system was equilibrated at 40° C. in THF, which served as the polymer solvent and eluent with a flow rate of 1.0 milliliters per minute (mL/min). Polymer solutions were prepared at a known concentration (3-5 milligrams per milliliter (mg/mL)) and an injection volume of 200 microliters (µL) was used. Data collection and analysis were performed with Precision Acquire software and Discovery 32 software (Precision Detectors, Inc.), respectively. Inter-detector delay volume and the light scattering detector calibration constant were determined by calibration using a nearly monodisperse polystyrene standard (Polymer Laboratories, $M_p$=90 kiloDaltons (kDa), $M_w/M_n$<1.04). The differential refractometer was calibrated with standard polystyrene reference material (SRM 706 NIST), of a known specific refractive index increment dn/dc (0.184 milliliters per gram (mL/g)). The dn/dc values of the analyzed polymers were then determined from the differential refractometer response.

The N,N-dimethylformamide (DMF) GPC was conducted on a Waters Chromatography Inc. (Milford, Mass.) system equipped with an isocratic pump model 1515, a differential refractometer model 2414, and a two-column set of Styragel HR 4 and HR 4E 5 µm DMF 7.8×300 mm columns. The system was equilibrated at 70° C. in pre-filtered DMF containing 0.05 M LiBr, which served as polymer solvent and eluent (flow rate set to 1.00 mL/min). Polymer solutions were prepared at a concentration of ca. 3 mg/mL and an injection volume of 200 µL was used. Data collection and analysis was performed with Empower Pro software (Waters Inc.). The system was calibrated with polystyrene standards (Polymer Laboratories) ranging from 615 to 442,800 Daltons.

The surface energy of the film was calculated using the Owens-Wendt-Rabel-Kaelble (OWRK) method after measuring the contact angle with an optical tensiometer (KSV Instruments, Attension Theta). The X-ray Photoelectron Spectroscopy (XPS) experiments were performed on a Kratos Axis Ultra XPS system with a monochromatic aluminum X-ray source (10 milliAmperes (mA), 12 kilovolts (kV)). The binding energy scale was calibrated to 285 electron volts (eV) for the main C1s (carbon 1s) peak.

The thin film fluorine depth profiles were obtained from a CAMECA 4F secondary ion mass spectrometer. Before measurement, the polymer film was coated with a thin layer of Pt/Pd alloy (80 wt %/20 wt %) at a thickness of 5 nm. The analyzed surface was sputtered by the 14.5 keV $Cs^+$ beam (diameter of ~1 µm) at a current of 6 nA. The raster was 500×500 µm2 for the spin-casted sample. The angle of incidence of the beam was 26°. The sputtering rates for polymer films, Pt/Pd film, and Si wafer were calculated by using the SRIM 2011.08 software.

The EBL was carried out by using JEOL JSM-6460 Scanning Electron Microscope (SEM) equipped with DEBEN laser stage. The system was operated at 30 kilovolt (kV) accelerating voltage and 10 picoAmperes (pA) beam current with series of exposure dosage ranging from 50 to 75 microcoulombs per square centimeter (µC/cm²) (corresponding to 1.5 to 2.25 millijoules per square centimeters (mJ/cm²)). The lithographic behavior of polymer resists was evaluated by using a 20×20 micrometers (µm) designed pattern with 70 nm/120 nm line width/space features and a 20×20 µm designed pattern with mixed 100 nm/100 nm line width/space and 100 nm/60 nm line width/space features, respectively.

The Atomic Force Microscopy (AFM) imaging was performed on MFP-3D system (Asylum Research) in tapping mode using standard silicon tips (VISTAprobes, T190-25, resonance constant: 190 kilohertz (kHz), tip radius: ~10 nm, spring constant: 48 newtons per meter (N/m). The Field Emission Scanning Electron Microscope (FE-SEM) images were collected with JEOL JSM-7500F using an accelerating voltage of 7 kV.

Example 1

Synthesis of the first polymer—norbornene-poly(5,5,5-trifluoro-4-hydroxy-2-methyl-4-(trifluoromethyl)pentyl methacrylate) (NB-PBTFHMBMA17): To a 25 mL Schlenk flask equipped with a magnetic stirring bar dried with flame under N2 atmosphere, was added NB-CTA (204 mg, 53.0 µmol), BTFHMBMA (4.93 g, 16.0 mmol), AIBN (12.9 mg, 79.6 µmol), and 8 mL of 2-butanone. The mixture was stirred 10 min at room temperature, deoxygenated through four cycles of freeze-pump-thaw and back-filled with N2. After the last cycle, the reaction mixture was stirred 10 minutes at room temperature and immersed into a pre-heated oil bath at 65° C. to start the polymerization. After 7.5 h, the polymerization was quenched by cooling the reaction flask with liquid N2. The polymer was purified by precipitation into 150 mL of cold hexane (~-10° C.) twice. The precipitate was collected through centrifugation, washed with 100 mL of hexane, and kept under vacuum overnight for removing residual solvents. Yield 1.6 g of product, 65% yield based upon ~45% conversion of BTFHMBMA. Mn, GPC=5,100 Da (THF GPC, RI detector), PDI=1.08. Mn, NMR=5,620 Da. 1H NMR (500 MHz, DMSO-d6, δ) 7.42-7.78 (m, Ar Hs from RAFT functionality and HOC(CF3)2), 6.08 (s, NB CH=CH), 3.70-4.20 (m, NB CH2OC(O) and BTFHMBMA CH2OC(O)), 0.76-2.80 (m, all CHs, CH2s and CH3s from NB ring and BTFHMBMA units).

Example 2

This example was conducted to demonstrate the manufacturing of the second polymer. As detailed above, the second polymer is a norbornene-poly(1-ethylcyclopentyl methacrylate)-b-poly(triphenylsulfonium 1,1-difluoro-2-(methacryloxy)ethanesulfonate)-co-poly(1-ethylcyclopentyl methacrylate)-b-poly(γ-butyrolactone-2-yl methacrylate).

Synthesis of M1 (NB-P(ECPMA25-co-GBLMA32)): To a 25 mL Schlenk flask equipped with a magnetic stirring bar dried with flame under N2 atmosphere, was added NB-CTA (196 mg, 0.508 mmol), ECPMA (2.31 g, 12.7 mmol), GBLMA (2.16 g, 12.7 mmol), AIBN (8.23 mg, 50.8 µmol), and 6 mL of 2-butanone. The mixture was stirred for 10 minutes at room temperature, deoxygenated through five cycles of freeze-pump-thaw and back-filled with N2. After the last cycle, the reaction mixture was stirred for 10 minutes at room temperature and immersed into a pre-heated oil bath at 65° C. to start the polymerization. After 14 hours, the polymerization was quenched by cooling the reaction flask with liquid N2. The copolymer was purified by precipitation into 250 mL of diethyl ether twice. The precipitate was collected through centrifugation, washed with 200 mL of diethyl ether and 200 mL of hexane, and kept under vacuum overnight for removing residual solvents. Yield 3.47 g of product, 86% yield based upon ~88% conversion of GBLMA, ~80% conversion of ECPMA, and ~80% conversion of NB-CTA. Mn, GPC=11,700 Da (laser detector), PDI=1.10. Mn, NMR=10,400 Da. 1H NMR (500 MHz, CDCl3, δ) 7.42-7.84 (m, Ar Hs from RAFT functionality), 6.08 (s, NB CH=CH), 5.28-5.48 (br, GBL OCHC(O)), 3.90-4.60 (m, NB CH2OC(O) and GBL CH2OC(O)), 0.76-2.76 (m, all CH2s and CH3s from NB ring, ECPMA units, and GBLMA units).

Example 3

Synthesis of macro-CTA (NB-P(TPS-DFSEMA$_4$-co-ECPMA$_{14}$)): To a 25 mL Schlenk flask equipped with a magnetic stirring bar dried with flame under N$_2$ atmosphere, was added NB-CTA (220 mg, 0.572 mmol), TPS-DFSEMA (563 mg, 1.15 mmol), ECPMA (1.88 g, 10.3 mmol), AIBN (13.9 mg, 85.8 µmol), and 6 mL of 2-butanone. The mixture was stirred for 10 minutes at room temperature, deoxygenated through four cycles of freeze-pump-thaw and back-filled with N$_2$. After the last cycle, the reaction mixture was stirred for 10 minutes at room temperature and immersed into a pre-heated oil bath at 65° C. to start the polymerization. After 20 hours, the polymerization was quenched by cooling the reaction flask with liquid N$_2$. The copolymer was purified by precipitation into 250 mL of MeOH/diethyl ether (v/v=6:94) twice. The precipitate was collected through centrifugation, washed with 200 mL of MeOH/diethyl ether (v/v=5:95) and 200 mL of diethyl ether, and kept under vacuum overnight for removing residual solvents. Yield 1.16 g of product, 56% yield based upon ~80% conversion of GBLMA, ~70% conversion of TPS-DFSEMA, and ~80% conversion of NB-CTA. M$_{n, GPC}$=8,700 Da (DMF GPC, RI detector), PDI=1.10. M$_{n, NMR}$=4,900 Da. $^1$H NMR (500 MHz, CD$_2$Cl$_2$, δ) 7.68-7.88 (m, Ar Hs from TPS functionality), 7.42-7.68 (m, Ar Hs from RAFT functionality), 6.08 (s, NB CH=CH), 4.26-4.74 (br, OCH$_2$CF$_2$ from DFSEMA), 3.90-4.16 (m, NB CH$_2$OC(O)), 0.76-2.80 (m, all CH$_2$s and CH$_3$s from NB ring, ECPMA units, and DFSEMA units).

Example 4

Synthesis of M2 (NB-P(TPS-DFMAES$_4$-co-ECPMA$_{14}$)-b-P(ECPMA$_{10}$-co-GBLMA$_{11}$)): To a 25 mL Schlenk flask equipped with a magnetic stirring bar dried with flame under N$_2$ atmosphere, was added macro-CTA (292 mg, 59.6 µmol), ECPMA (137 mg, 0.753 mmol), GBLMA (128 mg, 0.753 mmol), AIBN (1.46 mg, 8.94 µmol), and 2.2 mL of 2-butanone. The mixture was stirred 10 min at room temperature, deoxygenated through four cycles of freeze-pump-thaw and back-filled with N$_2$. After the last cycle, the reaction mixture was stirred for 10 minutes at room temperature and immersed into a pre-heated oil bath at 65° C. to start the polymerization. After 15 hours, the polymerization was quenched by cooling the reaction flask with liquid N$_2$. The copolymer was purified by precipitation into 45 mL of diethyl ether twice. The precipitate was collected through centrifugation, washed with 40 mL of MeOH and 100 mL of hexane, and kept under vacuum overnight for removing residual solvents. Yield 420 mg of product, 89% yield based upon ~75% conversion of GBLMA and ~60% conversion of ECPMA. M$_{n, GPC}$=13,100 Da (DMF GPC, RI detector), PDI=1.11. M$_{n, NMR}$=8,600 Da. $^1$H NMR (500 MHz, CDCl$_3$, δ) 7.68-7.88 (m, Ar Hs from TPS functionality), 7.42-7.68 (m, Ar Hs from RAFT functionality), 6.08 (s, NB CH=CH), 5.28-5.48 (br, GBL OCHC(O)), 3.90-4.74 (m, NB CH$_2$OC(O), GBL CH$_2$OC(O), and OCH$_2$CF$_2$ from DFSEMA), 0.76-2.80 (m, all CH$_2$s and CH$_3$s from NB ring, ECPMA units, GBLMA units, and DFSEMA units).

Example 5

Synthesis of block bottle brush polymer I (BBBP I) P(NB-g-P(ECPMA14-co-GBLMA32)35-b-P(NB-g-PBTF-HMBMA17)5). To a 10 mL Schlenk flask equipped with a magnetic stirring bar dried with flame under N2 atmosphere, was added the modified Grubbs catalyst (2.66 mg, 3.65 µmol) and 1 mL of anhydrous CH2Cl2. The mixture was stirred 1 min at room temperature, deoxygenated through three cycles of freeze-pump-thaw and back-filled with N2. After the last cycle, the solution of M1 (1.14 g, 0.11 mmol) in 5 mL of anhydrous CH2Cl2 (deoxygenated through three cycles of freeze-pump-thaw) was quickly added with an airtight syringe. The reaction mixture was allowed to stir for 4 hours at room temperature before adding the solution of M3 (125 mg, 22.0 µmol) in 0.6 mL of anhydrous THF (deoxygenated through three cycles of freeze-pump-thaw) with an airtight syringe. The reaction mixture was stirred for 3 hours at room temperature before quenching the polymerization by adding 0.6 mL of ethyl vinyl ether (EVE), and was further allowed to be stirred overnight at room temperature. The solution was precipitated into 125 mL of diethyl ether/MeOH (v/v=4:1). The precipitate was collected through centrifugation and re-dissolved into 15 mL of CH2Cl2. The solution was then precipitated into 200 mL of diethyl ether. The precipitate was collected through centrifugation, washed with 100 mL of MeOH/diethyl ether (v/v=1: 9) and 200 mL of hexane, and kept under vacuum overnight for removing residual solvents. Yield 970 mg of product, 81% yield based upon ~95% conversion for both M1 and for M3, respectively. Mn, GPC=443 kDa (laser detector), PDI=1.22. 1H NMR (500 MHz, DMSO-d6) δ 7.42-7.92 (m, Ar Hs from RAFT functionality and HOC(CF3)2), 5.22-5.76 (br, GBL OCHC(O) and brush backbone CH=CH), 3.80-4.70 (m, NB CH2OC(O) and GBL CH2OC(O)), 0.76-2.76 (m, all CH2s and CH3s from NB ring, ECPMA units, and GBLMA units).

Example 6

Synthesis of block bottle brush polymer II (BBBP II) (P(NB-g-(P(TPS-DFSEMA4-co-ECPMA14)-b-P (ECPMA10-co-GBLMA11))20-b-P(NB-g-PBTFH-MBMA17)4). To a 10 mL Schlenk flask equipped with a magnetic stirring bar dried with flame under N2 atmosphere, was added the modified Grubbs catalyst (1.65 mg, 2.26 μmol) and 0.5 mL of anhydrous CH2Cl2. The reaction mixture was stirred 1 min at room temperature to obtain a homogeneous solution and deoxygenated through three cycles of freeze-pump-thaw and back-filled with N2. After the last cycle, the solution of M2 (390 mg, 45.3 μmol) in 2.5 mL of anhydrous CH2Cl2 (deoxygenated through three cycles of freeze-pump-thaw) was quickly added with an airtight syringe. The reaction mixture was allowed to stir for 2.5 hours at room temperature (~0.2 mL aliquot was taken after 2 hours of stirring for GPC analysis) before adding the solution of M3 (48.2 mg, 8.53 μmol) in 0.35 mL of anhydrous THF/CH2Cl2 (v/v=1:6, deoxygenated through three cycles of freeze-pump-thaw) with an airtight syringe. The reaction mixture was stirred for 3 hours at room temperature before quenching the polymerization by adding 0.3 mL of EVE, and was further allowed to stirred for 10 hours at room temperature. The solution was diluted with 3 mL of CH2Cl2 and precipitated into 90 mL of diethyl ether. The precipitate was collected through centrifugation and re-dissolved into 10 mL of CH2Cl2. The solution was then precipitated into 90 mL of diethyl ether. The precipitate was collected through centrifugation, washed with 200 mL of hexane, and kept under vacuum overnight for removing residual solvents. Yield 350 mg of product, 89% yield based upon ~90% conversion for M2 and ~90% conversion for M3, respectively. Mn, GPC=124 kDa (DMF GPC, RI detector), PDI=1.25. 1H NMR (500 MHz, DMSO-d6) δ 7.68-7.88 (m, Ar Hs from TPS functionality), 7.42-7.68 (m, Ar Hs from RAFT functionality), 6.70-6.80 (br, HOC(CF3)2 from BTF-HMBMA), 5.22-5.70 (br, GBL OCHC(O) and brush backbone CH=CH), 4.25-4.80 (m, GBL CH2OC(O) and DFSEMA OCH2CF2), 3.70-4.18 (m, NB CH2OC(O) and BTFHMBMA (O)COCH2), 0.76-2.86 (m, all CHs, CH2s and CH3s from NB ring, ECPMA units, GBLMA units, BTFHMBMA units and DFSEA units).

Example 7

General procedure for the preparation of polymer thin film. The solution of BBBP I in PGEMA (1.0 wt %) or BBBP II in cyclohexanone (1.0 wt %) was prepared and passed through a PTFE syringe filter (220 nm pore size) before using. The solution was applied onto UV-O3 pre-treated silicon wafer and spin coated at 500 rpm for 5 seconds, followed by spinning at 3,000 rpm for 30 seconds (200 rpm/s acceleration rate for each step) to afford a thin film with 24 nm or 26 nm thickness, respectively.

The polymer film-coated silicon wafer was kept in a desiccator filled with saturated acetone atmosphere under vacuum for 20 hours. After the annealing process, the excess solvent was removed by pumping under vacuum and the N2 gas was slowly backfilled to open the desiccator.

Example 8

General procedure for preparation of BPCAR-I thin film for photolithography. The solution of BBBP I:PAG (0.8 wt %:0.2 wt %) in PGMEA was prepared and passed through a PTFE syringe filter (220 nm pore size) before using. The solution was applied onto UV-O3 pre-treated silicon wafer and spin coated at 500 rpm for 5 seconds, followed by spinning at 3,000 rpm for 30 seconds (200 rpm/s acceleration rate for each step) and PAB at 120° C. for 2-3 min to afford thin film with 21 nm thickness.

Example 9

General procedure for priming the UV-O3 treated wafer with PS-OH. The solution of PS-OH in cyclohexanone was prepared and passed through a PTFE syringe filter (220 nm pore size) before using. The solution was applied onto UV-O3 pre-treated silicon wafer and spin coated at 500 rpm for 5 seconds, followed by spinning at 3,000 rpm for 30 seconds (200 rpm/s acceleration rate for each step). The PS-OH treated wafer was then annealed under vacuum (~180 mmHg) at 120° C. for 24 h. The wafer was sonicated in toluene for 5 min to remove ungrafted PS-OH, washed with fresh toluene and dried by N2 flow.

Example 10

General procedure for preparation of BPCAR-I thin film for EBL. The solution of BBBP I:PAG (0.9 wt %:0.1 wt %) in cyclohexanone was prepared and passed through a PTFE syringe filter (220 nm pore size) before using. The solution was applied onto PS-OH (molecular weight, 4,000 Daltons by GPC) primed silicon wafer and spin coated at 500 rpm for 5 seconds, followed by spinning at 3,000 rpm for 30 seconds (200 rpm/s acceleration rate for each step) and PAB at 90° C. for 2 minutes to afford thin film with 25 nm thickness.

Example 11

General procedure for preparation of BPCAR-II thin film for photolithography. The solution of BBBP II in cyclohexanone (1.0 wt %) was prepared and passed through a PTFE syringe filter (220 nm pore size) before using. The solution was applied onto UV-O3 pre-treated silicon wafer and spin coated at 500 rpm for 5 seconds, followed by spinning at 3,000 rpm for 30 seconds (200 rpm/s acceleration rate for each step) and PAB at 120° C. for 2 min to and afford thin film with 26 nm thickness.

Example 12

General procedure for preparation of BPCAR-II thin film for EBL. The solution of BBBP II in cyclohexanone 0.75 wt %) was prepared and passed through a PTFE syringe filter (220 nm pore size) before using. The solution was applied onto PS-OH (molecular weight 10,000 Daltons by GPC) primed silicon wafer and spin coated at 500 rpm for 5 seconds, followed by spinning at 3,000 rpm for 30 seconds (200 rpm/s acceleration rate for each step) and PAB at 90° C. for 2-4 min to afford thin film.

Example 13

General procedure for photolithography. The polymer resist film-coated wafer was exposed to the UV light source (254 nm, 6 W) via a quartz photomask at a distance of about 20 cm for 2 minutes. After exposure, the exposed film was post-baked on a 120° C. hotplate for varied time and then the unexposed area was developed by dipping the wafer into 0.1 M tetramethylammonium hydroxide (TMAH) aqueous solution for 30-60 seconds, followed by rinsing with DI water and drying with $N_2$ flow.

Example 14

General procedure for EBL. After electron beam "writing" with predesigned pattern, the exposed wafer was post-baked on a 100° C. hotplate for 1-2 min and dipped into 0.1 M $TMAH_{(aq)}$ solution for 20-30 seconds. The wafers were rinsed with DI water and dried by $N_2$ flow. The results are shown in the Table 1 below.

TABLE 1

| Entry | PAB Time (min) | Exposure Time (min) | PEB Time (min) | Developer Conc. (M) | Develop Time (s) | Line Height from Resulting Patterns[a] (nm) | Line/space Feature from Resulting Patterns[a] (μm/μm) |
|---|---|---|---|---|---|---|---|
| #10 | 1 | 2 | 2 | 0.1 | 40 | 21 | 4.5/5.5 |
| #11 | 1 | 2 | 2 | 0.1 | 50 | 21 | 4.4/5.6 |
| #6 | 1 | 2 | 3 | 0.1 | 30 | 21 | 3.8/6.2 |
| #7 | 1 | 2 | 3 | 0.1 | 40 | 23 | 4.0/6.0 |
| #8 | 1 | 2 | 3 | 0.1 | 50 | 11 | 3.0/7.0 |
| #9 | 1 | 2 | 3 | 0.1 | 60 | ND | ND |
| #20 | 2 | 2 | 1 | 0.1 | 40 | 21 | 5.5/4.5 |
| #21 | 2 | 2 | 1 | 0.1 | 50 | 20 | 5.7/4.3 |
| #12 | 2 | 2 | 2 | 0.1 | 40 | 21 | 5/5 |
| #18 | 2 | 2 | 2 | 0.1 | 50 | 21 | 4.9/5.1 |
| #19 | 2 | 2 | 2 | 0.1 | 60 | 21 | 5.1/4.9 |
| #14 | 3 | 2 | 1 | 0.1 | 40 | ND | ND |
| #15 | 3 | 2 | 1 | 0.1 | 50 | 22 | 5.1/4.9 |
| #16 | 3 | 2 | 1 | 0.1 | 60 | 22 | 3.5/6.5 |

[a]Measured by AFM.
ND: Not determined as no discrete pattern was generated.

Figure 3:
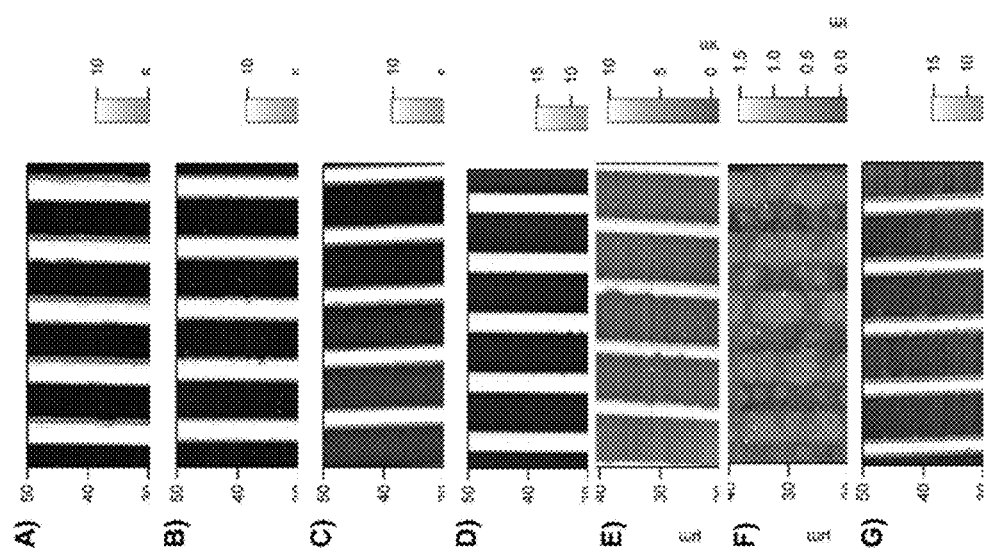
FIG. 3 shows micrographs obtained from tapping mode atomic force microscopy (AFM) height images of patterns generated by 254 nm photolithography of positive-tone bottle brush chemically amplified resist I (PBCAR-I) at varied conditions.
Figure 4:
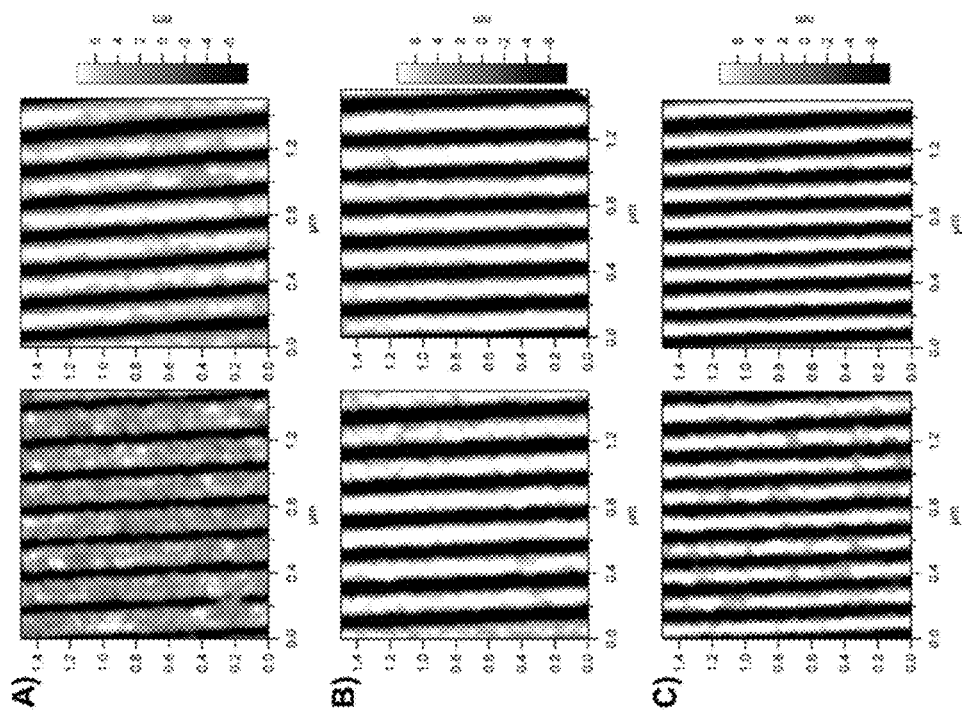
FIG. 4 displays micrographs showing tapping mode AFM height images of patterns generated by 30 kV EBL of PBCAR-I at 50 µC/cm2 exposure dosage (left) and 60 µC/cm2 exposure dosage (right), respectively, and PEB at 100° C. for 2 minutes.
Figure 5:
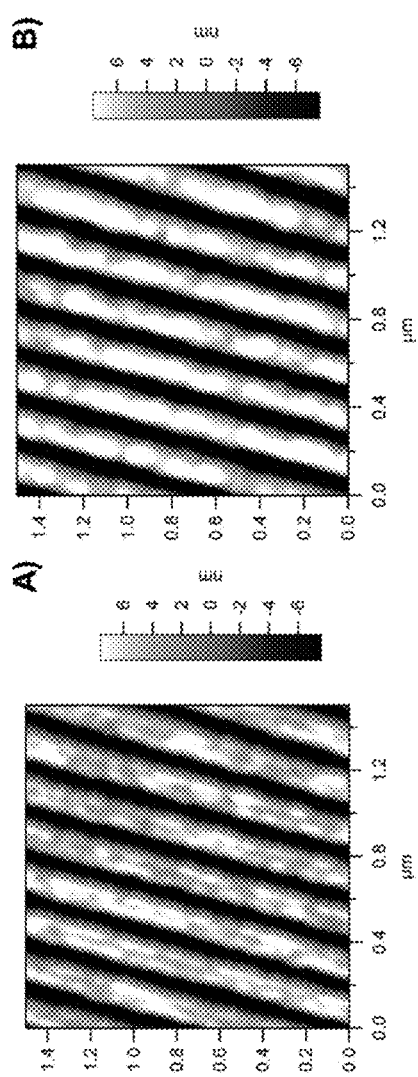
FIG. 5 displays micrographs showing tapping mode AFM height images of patterns generated by 30 kV EBL of PBCAR-II at 75 µC/cm² exposure dosage, and PEB at 100° C. for 1 minute.

FIG. 3 shows micrographs obtained from tapping mode atomic force microscopy (AFM) height images of patterns generated by 254 nm photolithography of PBCAR-I at varied conditions. FIGS. 3 (A) through (G) reflect AFM height image of pattern from Table 1 Entry #10, #11, #6, #7, #8, #14, and #16, respectively. FIG. 4 displays micrographs showing tapping mode AFM height images of patterns generated by 30 kV EBL of PBCAR-I at 50 μC/cm² exposure dosage (left) and 60 μC/cm² exposure dosage (right), respectively, and PEB at 100° C. for 2 minutes. FIG. 4 (A) Patterns with 120 nm/70 nm line/space designed features. FIG. 4 (B) Patterns with 100 nm/100 nm line/space designed features. FIG. 4 (C) Patterns with 60 nm/100 nm line/space designed features. FIG. 5 displays micrographs showing tapping mode AFM height images of patterns generated by 30 kV EBL of PBCAR-II at 75 μC/cm² exposure dosage, and PEB at 100° C. for 1 minute. FIG. 5 (A) shows patterns with 120 nm/70 nm line/space designed features. FIG. 5 (B) shows patterns with 100 nm/100 nm line/space designed features.

What is claimed is:

1. A graft block copolymer comprising:
a first block polymer; the first block polymer comprising a backbone polymer and a first graft polymer; where the first graft polymer comprises a repeat unit comprising a surface energy reducing moiety chosen from a halocarbon containing moiety, a silicon containing moiety, or a combination of a halocarbon moiety and a silicon containing moiety; and
a second block polymer; the second block polymer being covalently bonded to the first block; wherein the second block comprises the backbone polymer and a second graft polymer; where the second graft polymer comprises a functional group that is operative to undergo acid-catalyzed deprotection causing a change of solubility of the graft block copolymer in a developer solvent; where the second graft polymer comprises poly(1-ethylcyclopentyl methacrylate).

2. The copolymer of claim 1, where the backbone polymer is a polynorbornene.

3. The copolymer of claim 1, where the first graft polymer is a polymer derived from the polymerization of a fluorinated (meth)acrylate or a fluorinated (meth)acrylic.

4. The copolymer of claim 1, where the first graft polymer comprises poly(5,5,5-trifluoro-4-hydroxy-2-methyl-4-(trifluoromethyl)pentyl methacrylate).

5. The copolymer of claim 1, where the second graft polymer comprises a poly(1-tri(alkyl)methyl methacrylate).

6. The copolymer of claim 1, where the second graft polymer is a copolymer derived from the polymerization of at least two of 1-ethylcyclopentyl methacrylate, γ-butyrolactone-2-yl methacrylate, tertiary butoxycarbonyl protected hydroxystyrene, N-phenyl maleimide and triphenylsulfonium 1,1-difluoro-2-(methacryloxy)ethanesulfonate.

7. The copolymer of claim 1, where the second graft polymer comprises a first block copolymer and a second block copolymer; where the first block copolymer comprises poly(1-ethylcyclopentyl methacrylate) and poly(triphenylsulfonium 1,1-difluoro-2-(methacryloxy)ethanesulfonate) and where the second block copolymer comprises poly(1-ethylcyclopentyl methacrylate and poly(γ-butyrolactone-2-yl methacrylate).

8. The copolymer of claim 1, where the first graft polymer and/or the second graft polymer each comprise a functional group that undergoes acid-catalyzed deprotection causing a change of solubility of the graft block copolymer in a developer solvent and where the graft block copolymer further comprises a photoacid generator.

9. A method of manufacturing a graft block copolymer comprising:
reacting a precursor to a backbone polymer with a first chain transfer agent to form a first backbone polymer precursor-chain transfer agent moiety;
reacting the first backbone polymer precursor-chain transfer agent moiety with a precursor to a first graft polymer;
polymerizing the precursor to the first graft polymer to form a first graft polymer; where the first graft polymer comprises a repeat unit comprising a surface energy reducing moiety chosen from a halocarbon containing moiety, a silicon containing moiety, or a combination of a halocarbon moiety and a silicon containing moiety;
polymerizing the backbone polymer precursor of the first graft polymer to form the first block polymer;
reacting a precursor to a backbone polymer with a second chain transfer agent to form a second backbone polymer precursor-chain transfer agent moiety;
reacting the second backbone polymer precursor-chain transfer agent moiety with a precursor or precursors to a second graft copolymer;
polymerizing the precursor or precursors to the second graft polymer to form the second graft polymer; where the second graft polymer comprises a functional group that is operative to undergo acid-catalyzed deprotection causing a change of solubility of the graft block copolymer in a developer solvent; and
polymerizing the backbone polymer precursor of the second graft polymer to form the second block polymer; and
reacting the first block polymer with the second block polymer to form the graft block copolymer.

* * * * *